(12) United States Patent
Ogawa et al.

(10) Patent No.: US 10,843,448 B2
(45) Date of Patent: Nov. 24, 2020

(54) METHOD OF MANUFACTURING IMAGE DISPLAY DEVICE

(71) Applicant: DEXERIALS CORPORATION, Tokyo (JP)

(72) Inventors: Kouichi Ogawa, Utsunomiya (JP); Yoshihisa Shinya, Utsunomiya (JP); Naoki Hayashi, Utsunomiya (JP); Tomoyuki Toyoda, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 16/369,739

(22) Filed: Mar. 29, 2019

(65) Prior Publication Data

US 2019/0224955 A1 Jul. 25, 2019

Related U.S. Application Data

(63) Continuation of application No. 14/486,354, filed on Sep. 15, 2014, now Pat. No. 10,759,156, which is a
(Continued)

(30) Foreign Application Priority Data

Jan. 25, 2012 (JP) .................................. 2012-012904
Dec. 14, 2012 (JP) .................................. 2012-273685

(51) Int. Cl.
*B32B 38/00* (2006.01)
*G02B 1/14* (2015.01)
(Continued)

(52) U.S. Cl.
CPC ............ *B32B 38/0008* (2013.01); *G02B 1/14* (2015.01); *G02F 1/1303* (2013.01);
(Continued)

(58) Field of Classification Search
CPC ......... G02B 1/14; G02B 1/105; G02F 1/1303; G02F 1/1333; G02F 1/133512; B32B 38/0008
(Continued)

(56) References Cited

U.S. PATENT DOCUMENTS 7,910,033 B2   3/2011  Kamata et al.
2009/0162645 A1  6/2009  Matsuhira
(Continued)

FOREIGN PATENT DOCUMENTS

CN   101542363 A   9/2009
CN   101652804 A   2/2010
(Continued)

OTHER PUBLICATIONS

Jan. 19, 2015 Observation by a Third Party issued in European Application No. 13724717.7.
(Continued)

*Primary Examiner* — Michael N Orlando
*Assistant Examiner* — Elizabeth Bradford
(74) *Attorney, Agent, or Firm* — Oliff PLC

(57) ABSTRACT

According to a method of manufacturing an image display device of the present invention, a photo-curable resin composition in a liquid state is applied to a surface of a light-transmitting cover member including a light-shielding layer or a surface of the image display member to a thickness greater than that of the light-shielding layer. Then, in this state, the photo-curable resin composition is irradiated with a UV ray to be pre-cured, thereby forming a pre-cured resin layer. Next, the image display member and the light-transmitting cover member are stacked via the pre-cured resin layer and thereafter, the pre-cured resin layer is irradiated with a UV ray to be completely cured, thereby forming a light-transmitting cured resin layer.

14 Claims, 9 Drawing Sheets

Related U.S. Application Data continuation of application No. 13/990,923, filed as application No. PCT/JP2013/051423 on Jan. 24, 2013, now abandoned.

(51) Int. Cl.
  *G02F 1/1333* (2006.01)
  *G02F 1/1335* (2006.01)
  *G02F 1/13* (2006.01)
  *H01L 51/52* (2006.01)

(52) U.S. Cl.
  CPC ...... *G02F 1/1333* (2013.01); *G02F 1/133512* (2013.01); *B32B 2310/0831* (2013.01); *B32B 2333/08* (2013.01); *B32B 2457/20* (2013.01); *G02F 2001/133331* (2013.01); *G02F 2001/133388* (2013.01); *G02F 2202/28* (2013.01); *H01L 51/524* (2013.01)

(58) Field of Classification Search
  USPC ..................................................... 156/275.5
  See application file for complete search history.

(56) References Cited

U.S. PATENT DOCUMENTS

| | | |
|---|---|---|
| 2009/0305068 A1 | 12/2009 | Morishita et al. |
| 2010/0003425 A1 | 1/2010 | Kamata et al. |
| 2010/0043965 A1 | 2/2010 | Kamiya et al. |
| 2010/0086705 A1 | 4/2010 | Everaerts et al. |
| 2010/0277684 A1 | 11/2010 | Fukushima et al. |
| 2011/0033720 A1 | 2/2011 | Fujita et al. |
| 2011/0134378 A1 | 6/2011 | Tsuboi et al. |
| 2011/0177261 A1 | 7/2011 | Ishii et al. |
| 2013/0029075 A1 | 1/2013 | Niiyama et al. |
| 2013/0302539 A1 | 11/2013 | Fujii et al. |
| 2015/0224756 A1 | 8/2015 | Kobayashi et al. |

FOREIGN PATENT DOCUMENTS

| | | |
|---|---|---|
| CN | 101681571 A | 3/2010 |
| CN | 101681575 A | 3/2010 |
| CN | 101816026 A | 8/2010 |
| CN | 103403784 B | 6/2016 |
| CN | 105807469 B | 7/2019 |
| EP | 2 136 348 A1 | 12/2009 |
| EP | 2144218 A1 | 1/2010 |
| JP | 2009-024055 A | 2/2009 |
| JP | 2009-86656 A | 4/2009 |
| JP | 2009-127023 A | 6/2009 |
| JP | 2009-186954 A | 8/2009 |
| JP | 2011-138099 A | 7/2011 |
| JP | 2012-071281 A | 4/2012 |
| JP | 2012073533 A | 4/2012 |
| TW | 201026801 A | 7/2010 |
| TW | 201331683 A | 8/2013 |
| TW | I479202 B | 4/2015 |
| TW | I671372 B | 9/2019 |
| WO | 2004/108774 A1 | 12/2004 |
| WO | 2007/066590 A1 | 6/2007 |
| WO | 2008/126860 A1 | 10/2008 |
| WO | 2009/011353 A1 | 1/2009 |
| WO | 2009/054168 A1 | 4/2009 |
| WO | 2010/027041 A1 | 3/2010 |
| WO | 2011/084405 A1 | 7/2011 |
| WO | 2011/148990 A1 | 12/2011 |
| WO | 2012/099171 A1 | 7/2012 |

OTHER PUBLICATIONS

Jan. 5, 2015 Office Action issued in Chinese Application No. 201380000424.1.
May 22, 2015 Office Action issued in Korean Application No. 10-2013-7015229.
Aug. 26, 2015 Office Action issued in Chinese Application No. 201380000424.1.
Aug. 24, 2015 Office Action issued in Chinese Application No. 201410061256.3.
Dec. 23, 2015 Office Action issued in Korean Application No. 10-2013-7015229.
Apr. 22, 2016 Office Action issued in Korean Application No. 10-2013-7015229.
Apr. 22, 2016 Office Action issued in Chinese Application No. 201410061256.3.
May 17, 2016 Office Action issued in Taiwanese Application No. 103146233.
Sep. 26, 2016 Office Action issued in Chinese Patent Application No. 201410061256.3.
Feb. 4, 2017 Office Action issued in Chinese Application No. 201510294461.9.
Feb. 23, 2017 Office Action issued in Chinese Application No. 201410061256.3.
Aug. 27, 2014 Office Action issued in Korean Patent Application No. 10-2013-7015229.
Jul. 1, 2014 Office Action issued in Taiwanese Patent Application No. 102102837.
May 5, 2014 Office Action issued in Chinese Patent Application No. 201380000424.1.
Feb. 24, 2014 Office Action issued in Taiwanese Patent Application No. 102102837.
Apr. 9, 2013 International Search Report issued in International Application No. PCT/JP2013/051423.
Oct. 9, 2017 Office Action issued in Chinese Patent Application No. 201510294461.9.
Mar. 30, 2018 Office Action issued in Korean Application No. 10-2014-7009273.
May 1, 2018 Office Action issued in Korean Application No. 10-2016-7013808.
May 1, 2018 Office Action issued in Korean Application No. 10-2016-7007679.
Jul. 18, 2018 Office Action issued in Chinese Application No. 201610333683.1.
Feb. 17, 2015 extended European Search Report issued in European Application No. 13724717.7.
Sep. 17, 2018 Office Action issued in European Application No. 13 724 717.7.
Aug. 7, 2014 International Preliminary Report on Patentability issued in International Application No. PCT/JP2013/051423.
Sep. 4, 2013 Written Opinion of the International Searching Authority issued in International Application No. PCT/JP2013/051423.
May 21, 2019 Office Action issued in Korean Application No. 10-2019-7012191.
Aug. 12, 2019 Office Action issued in Chinese Patent Application No. 201510966227.6.
Sep. 20, 2019 Office Action issued in Chinese Patent Application No. 201610333683.1.
Apr. 17, 2019 Office Action issued in Chinese Application No. 201610333638.6.
Mar. 27, 2019 Office Action issued in Chinese Patent Application No. 201510966227.6.
Apr. 24, 2019 Communication issued in European Patent Application No. 13724717.7.
Apr. 1, 2019 Decision on Rejection issued in Chinese Patent Application No. 20160333683.1.
Jul. 15, 2020 extended European Search Report issued in European Patent Application No. 20178301.6.
May 11, 2020 Office Action issued in Chinese Patent Application No. 201510966227.6.
Apr. 3, 2020 Office Action issued in U.S. Appl. No. 14/486,354.
Jan. 22, 2020 Office Action issued in Chinese Patent Application No. 2016-10333638.6.
Nov. 29, 2019 Office Action issued in Taiwanese Patent Application No. 108120975.
Nov. 18, 2019 Office Action issued in Chinese Patent Application No. 201510966227.6.
Mar. 10, 2020 Office Action issued in Chinese Patent Application No. 201610333683.1.

(56) References Cited

OTHER PUBLICATIONS

Jul. 28, 2020 Office Action issued in Korean Patent Application No. 10-2020-7020936.
Jun. 24, 2020 Notice of Allowance issued in U.S. Appl. No. 14/486,354.

[FIG. 1A]
[FIG. 1B]
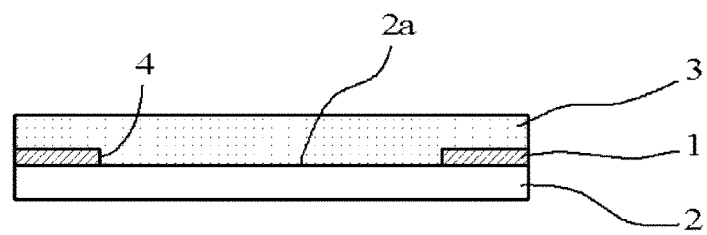
[FIG. 1C]
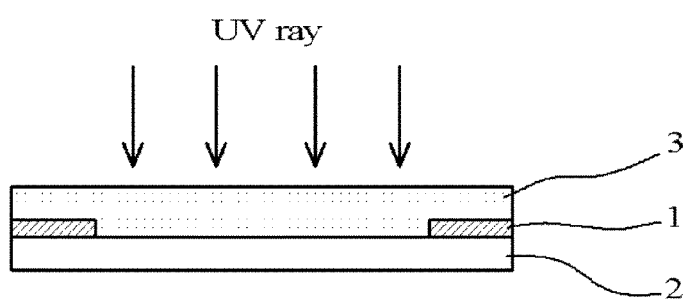
[FIG. 1D]
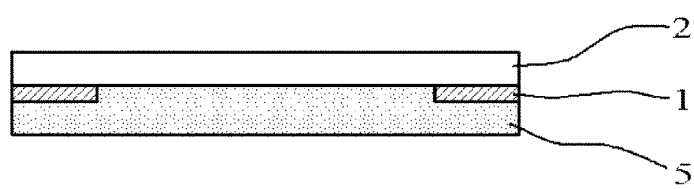
[FIG. 1E]
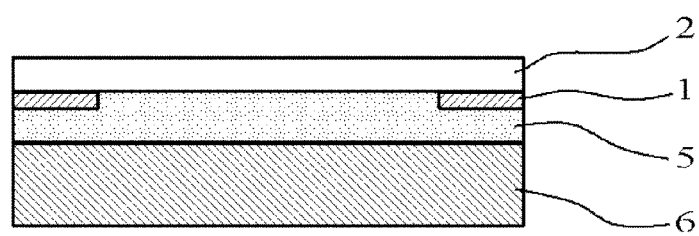

[FIG. 1F]
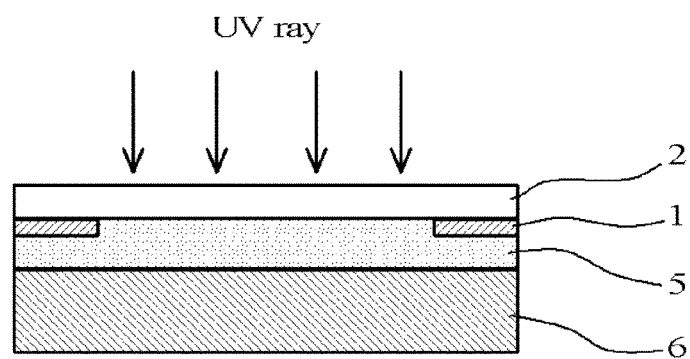
[FIG. 1G]
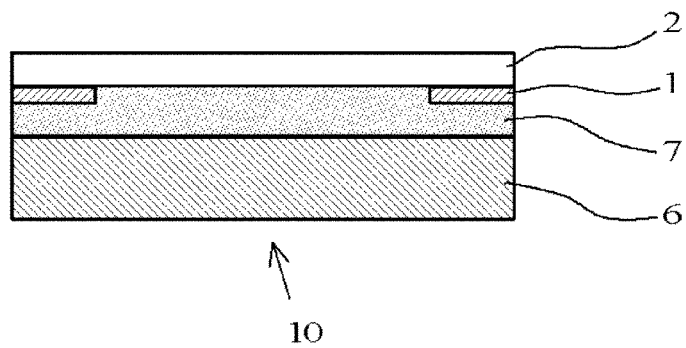

[FIG. 2A]
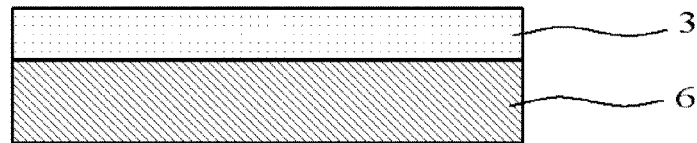
[FIG. 2B]
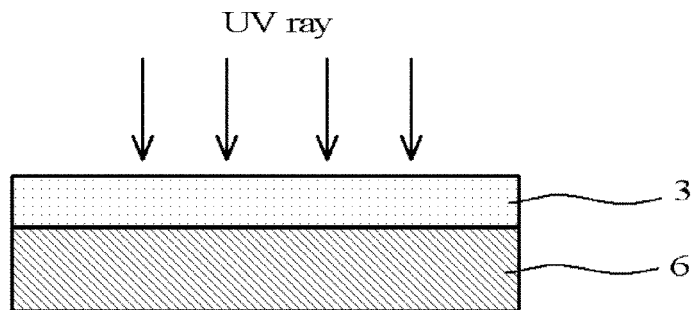
[FIG. 2C]
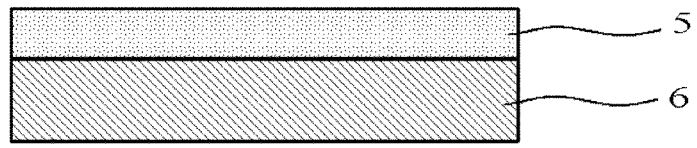
[FIG. 2D]
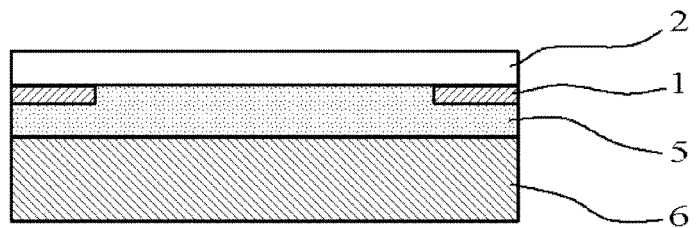

[FIG. 2E]
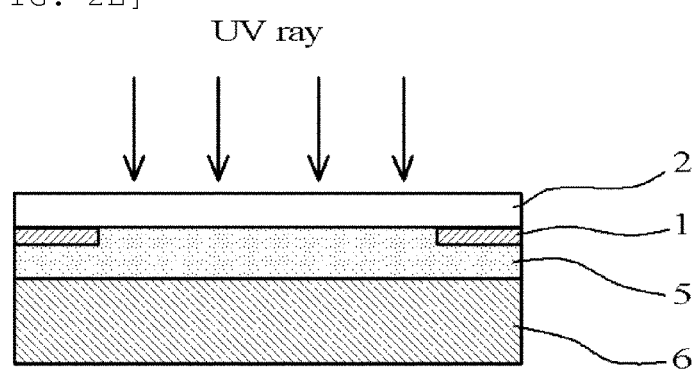
[FIG. 2F]
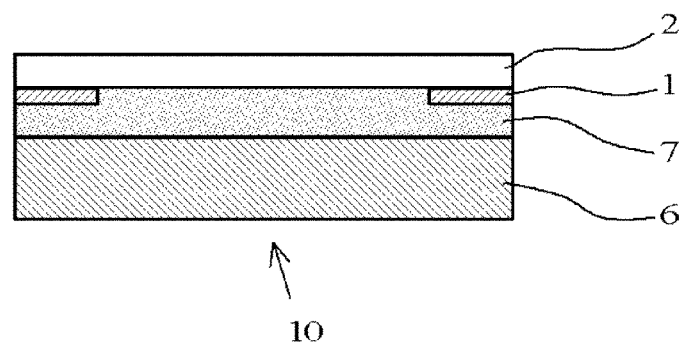

[FIG. 3A]
[FIG. 3B]
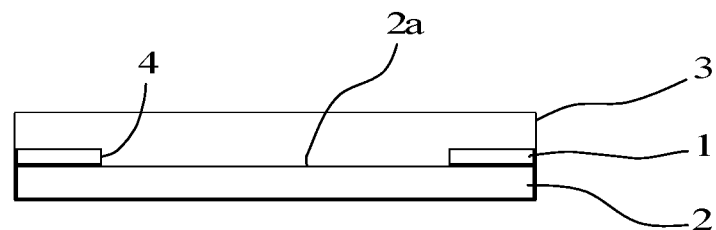
[FIG. 3C]
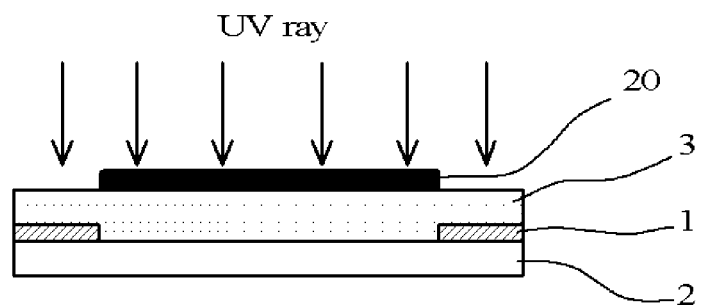
[FIG. 3D]
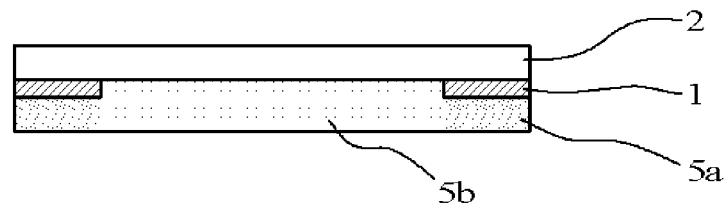
[FIG. 3E]
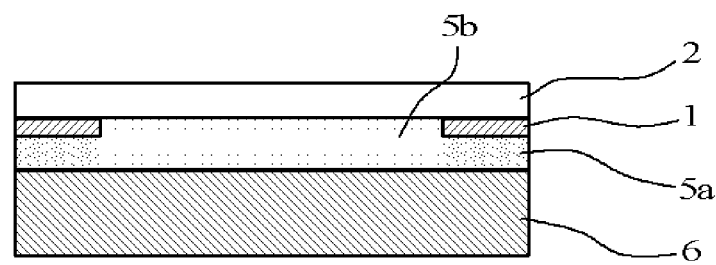

[FIG. 3F]
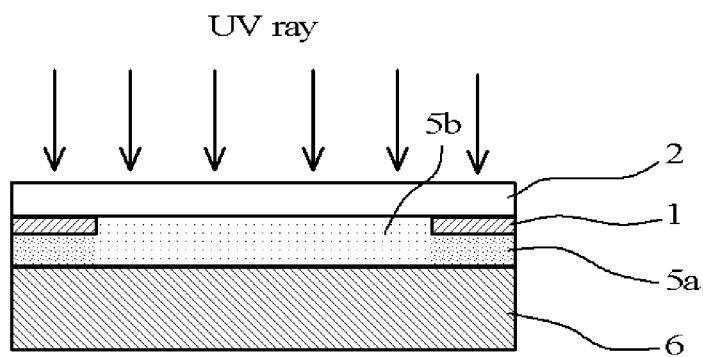
[FIG. 3G]
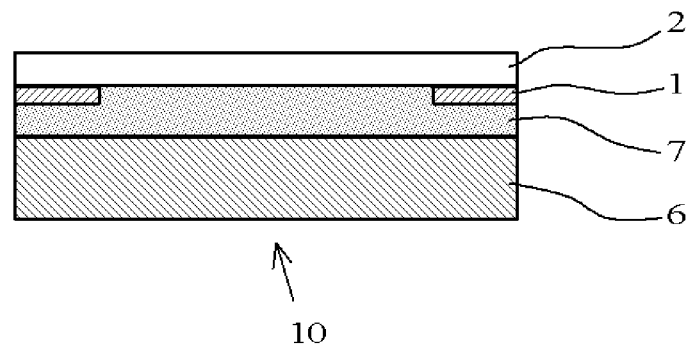

[FIG. 4A]
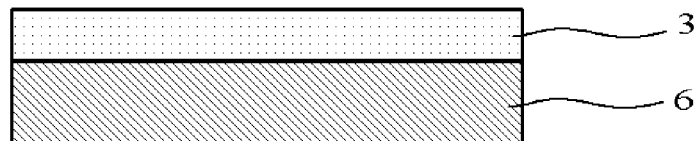
[FIG. 4B]
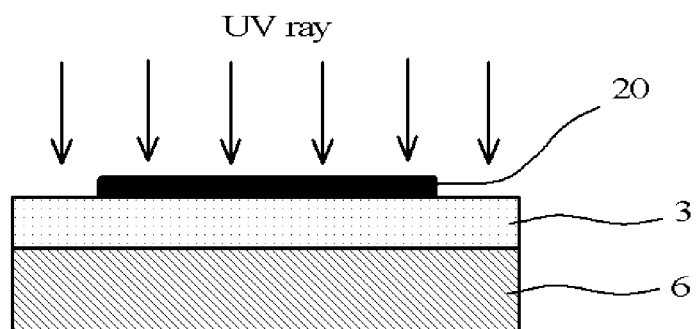
[FIG. 4C]
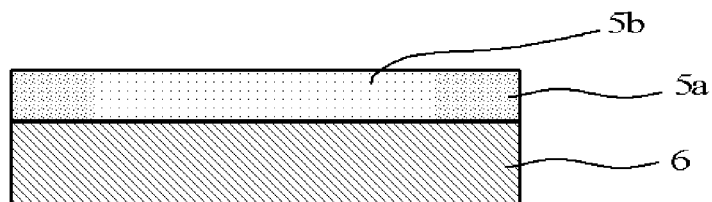
[FIG. 4D]
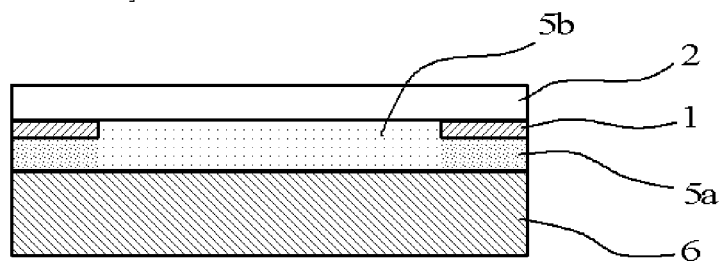

[FIG. 4E]
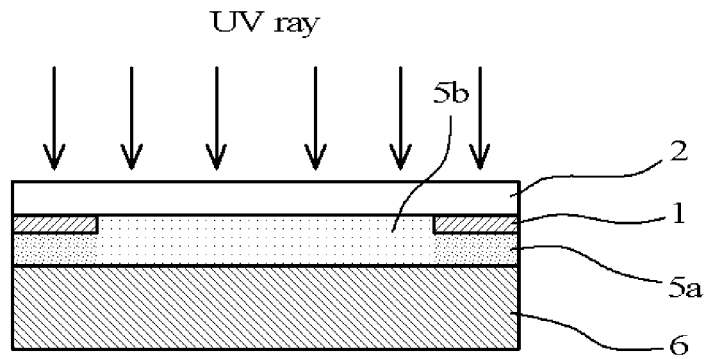
[FIG. 4F]
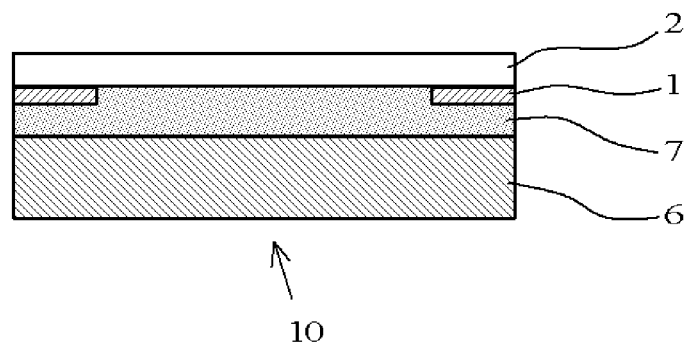
[FIG. 5]
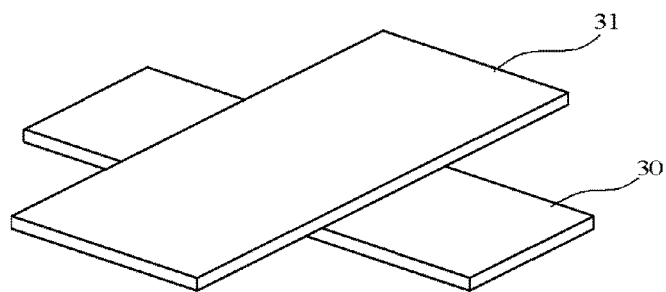

[FIG. 6A]
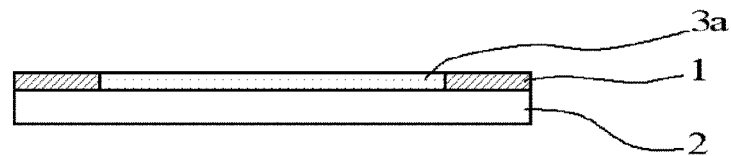
[FIG. 6B]
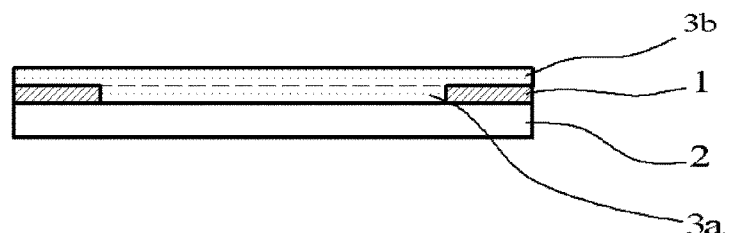
[FIG. 7]
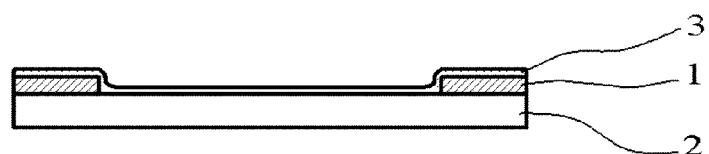
[FIG. 8]
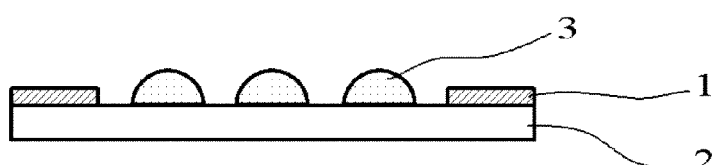
[FIG. 9]
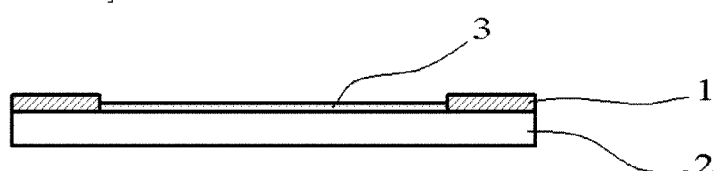

METHOD OF MANUFACTURING IMAGE DISPLAY DEVICE

This is a Continuation of U.S. application Ser. No. 14/486,354 filed Sep. 15, 2014, which in turn is a Continuation of U.S. application Ser. No. 13/990,923, filed May 31, 2013, which in turn is a National Phase of Application No. PCT/JP2013/051423 filed Jan. 24, 2013, which claims the benefit of Japanese Application No. 2012-273685 filed Dec. 14, 2012 and Japanese Application No. 2012-012904 filed Jan. 25, 2012. The disclosure of the prior applications is hereby incorporated by reference herein in its entirety.

TECHNICAL FIELD

The present invention relates to a method of manufacturing an image display device by bonding and stacking, via a light-transmitting cured resin layer, an image display member such as a liquid crystal display panel and a light-transmitting cover member such as a transparent protective sheet to be arranged on the side of a surface of the image display member.

BACKGROUND ART

An image display device such as a liquid crystal display panel used in information terminals such as smartphones is manufactured by providing a photo-curable resin composition between an image display member such as a liquid crystal display panel and an organic EL panel and a light-transmitting cover member, and then irradiating the composition with a UV ray and curing the composition to form a light-transmitting cured resin layer, thereby bonding and stacking the image display member and the light-transmitting cover member (Patent Literature 1).

A light-shielding layer is provided on a peripheral part of a surface of the light-transmitting cover member on the side of the image display part to enhance brightness and contrast of a display image. Hence, curing of the photo-curable resin composition held between the light-shielding layer and the image display member does not proceed sufficiently, so that sufficient adhesive force cannot be achieved. This may cause the problem of separation between the light-transmitting cover member and the image display member, reduction in image quality due to entry of humidity into a gap between the light-transmitting cover member and the image display member, and the like.

In response, it has been suggested that a heat polymerization initiator is mixed with the photo-curable resin composition to form a thermosetting and photo-curable resin composition, the thermosetting and photo-curable resin composition is applied to the surface of the light-transmitting cover member on which the light-shielding layer has been formed, the resultant coated surface is placed over the image display member, the thermosetting and photo-curable resin composition is irradiated with a UV ray to be photo-cured, and then the entire structure is heated to heat-cure the thermosetting and photo-curable resin composition held between the light-shielding layer and the image display member (Patent Literature 2).

CITATION LIST

Patent Literature

Patent Literature 1: International Publication No. 2010/027041
Patent Literature 2: International Publication No. 2008/126860

SUMMARY OF INVENTION

Technical Problem

The technique of Patent Literature 2 is expected to overcome the problems concerned in Patent Literature 1. However, the heat polymerization initiator is used simultaneously with a photopolymerization initiator, and heat polymerization process should be performed in addition to photopolymerization process. This leads to the problems such as increase in burden of a capital investment for the heat polymerization process and reduction in preservation stability of the thermosetting and photo-curable resin composition. Further, curing process has not been performed yet at a time when the light-transmitting cover member coated with the thermosetting and photo-curable resin composition and the image display member are placed one above the other. Hence, the resin composition is eliminated from between the light-shielding layer and the surface of the light-transmitting cover member, so that a step between the light-shielding layer and the surface of the light-transmitting cover member cannot be canceled. This may also cause the problems of generation of air bubbles and interlayer delamination between the light-transmitting cover member and the resin.

It is an object of the present invention to solve the aforementioned problems in the conventional techniques. An object of the present invention is to manufacture an image display device such that, even without performing heat polymerization process, a photo-curable resin composition between a light-shielding layer and an image display member is photo-cured sufficiently without being eliminated from therebetween, and a step between the light-shielding layer and a surface of a light-transmitting cover member can be canceled.

Solution to Problem

The present inventors have found that a light-transmitting cured resin layer between a light-shielding layer and an image display member can be photo-cured sufficiently without being eliminated from therebetween and a step between the light-shielding layer and a light-shielding layer forming surface of a light-transmitting cover member can be canceled by applying a liquid photo-curable resin composition once to a surface of the light-transmitting cover member including the light-shielding layer or a surface of the image display member to a thickness greater than that of the light-shielding layer, then by irradiating the applied photo-curable resin composition entirely or at least part of the applied photo-curable resin composition existing on the light-shielding layer with a UV ray to pre-cure the photo-curable resin composition, then by stacking via a resultant pre-cured resin layer the image display member and the light-transmitting cover member, and then by completely curing the resin layer with UV irradiation. As a result, the inventors attained the present invention.

To be specific, the present invention provides a method of manufacturing an image display device where an image display member and a light-transmitting cover member with a light-shielding layer formed on a peripheral part thereof are stacked via a light-transmitting cured resin layer formed of a liquid photo-curable resin composition, such that a light-shielding layer forming surface of the light-transmitting cover member is arranged on the side of the image display member. The method includes the following steps (A) to (D).

<Step (A)>

A step of applying the liquid photo-curable resin composition to the light-shielding layer forming surface of the light-transmitting cover member or a surface of the image display member to a thickness greater than that of the light-shielding layer so as to cancel a step formed between the light-shielding layer and the light-shielding layer forming surface of the light-transmitting cover member.

<Step (B)>

A step of irradiating the applied photo-curable resin composition with a UV ray to pre-cure the photo-curable resin composition, thereby forming a pre-cured resin layer.

<Step (C)>

A step of bonding the light-transmitting cover member to the image display member such that the light-shielding layer and the pre-cured resin layer are placed inside.

<Step (D)>

A step of irradiating the pre-cured resin layer held between the image display member and the light-transmitting cover member with a UV ray to completely cure the pre-cured resin layer to stack the image display member and the light-transmitting cover member via the light-transmitting cured resin layer, thereby obtaining the image display device.

A preferred aspect of the step (B) can include the following step.

To be specific, in this step, at least part of the photo-curable resin composition existing on the light-shielding layer is irradiated with a UV ray to be pre-cured to make the cure rate of the pre-cured resin layer on the light-shielding layer from 30 to 80%. In this case, it is preferred that the cure rate of the pre-cured resin layer on the surface of the light-transmitting cover member be from 0 to 80%. It is also preferred that the cure rate of the pre-cured resin layer on the light-shielding layer be higher than that of the pre-cured resin layer on the surface of the light-transmitting cover member. It is preferred that such cure rates be achieved by disposing a shielding plate to shield a UV ray or an attenuation plate to attenuate a UV ray between a UV source and the applied photo-curable resin composition during UV irradiation.

Advantageous Effects of Invention

According to the method of manufacturing an image display device of the present invention, a liquid photo-curable resin composition is applied to a surface of a light-transmitting cover member including a light-shielding layer or a surface of an image display member to a thickness greater than that of the light-shielding layer. Then, the photo-curable resin composition is irradiated with a UV ray to be pre-cured, thereby forming a pre-cured resin layer at least on the light-shielding layer. Next, the image display member and the light-transmitting cover member are stacked via the pre-cured resin layer and thereafter, the pre-cured resin layer is irradiated with a UV ray to be completely cured, thereby forming a light-transmitting cured resin layer. Thus, even without performing heat polymerization process, the light-transmitting cured resin layer between the light-shielding layer and the image display member is photo-cured sufficiently without being eliminated from therebetween. Further, a step between the light-shielding layer and a light-shielding layer forming surface of the light-transmitting cover member can be canceled.

BRIEF DESCRIPTION OF DRAWINGS

FIG. 1A is an explanatory view of a step (A) of a method of manufacturing an image display device of the present invention.

FIG. 1B is an explanatory view of the step (A) of the method of manufacturing the image display device of the present invention.

FIG. 1C is an explanatory view of a step (B) of the method of manufacturing the image display device of the present invention.

FIG. 1D is an explanatory view of the step (B) of the method of manufacturing the image display device of the present invention.

FIG. 1E is an explanatory view of a step (C) of the method of manufacturing the image display device of the present invention.

FIG. 1F is an explanatory view of a step (D) of the method of manufacturing the image display device of the present invention.

FIG. 1G is an explanatory view of the step (D) of the method of manufacturing the image display device of the present invention.

FIG. 2A is an explanatory view of a step (AA) of the method of manufacturing the image display device of the present invention.

FIG. 2B is an explanatory view of a step (BB) of the method of manufacturing the image display device of the present invention.

FIG. 2C is an explanatory view of the step (BB) of the method of manufacturing the image display device of the present invention.

FIG. 2D is an explanatory view of a step (CC) of the method of manufacturing the image display device of the present invention.

FIG. 2E is an explanatory view of a step (DD) of the method of manufacturing the image display device of the present invention.

FIG. 2F is an explanatory view of the step (DD) of the method of manufacturing the image display device of the present invention.

FIG. 3A is an explanatory view of a step (a) of the method of manufacturing the image display device of the present invention.

FIG. 3B is an explanatory view of the step (a) of the method of manufacturing the image display device of the present invention.

FIG. 3C is an explanatory view of a step (b) of the method of manufacturing the image display device of the present invention.

FIG. 3D is an explanatory view of the step (b) of the method of manufacturing the image display device of the present invention.

FIG. 3E is an explanatory view of a step (c) of the method of manufacturing the image display device of the present invention.

FIG. 3F is an explanatory view of the step (c) of the method of manufacturing the image display device of the present invention.

FIG. 3G is an explanatory view of a step (d) of the method of manufacturing the image display device of the present invention.

FIG. 4A is an explanatory view of a step (aa) of the method of manufacturing the image display device of the present invention.

FIG. 4B is an explanatory view of a step (bb) of the method of manufacturing the image display device of the present invention.

FIG. 4C is an explanatory view of the step (bb) of the method of manufacturing the image display device of the present invention.

FIG. 4D is an explanatory view of a step (cc) of the method of manufacturing the image display device of the present invention.

FIG. 4E is an explanatory view of a step (dd) of the method of manufacturing the image display device of the present invention.

FIG. 4F is an explanatory view of the step (dd) of the method of manufacturing the image display device of the present invention.

FIG. 5 is an explanatory view of an adhesive strength test of a light-transmitting cured resin layer.

FIG. 6A is an explanatory view of an aspect of application of a photo-curable resin composition to a light-transmitting cover member in Example 4.

FIG. 6B is an explanatory view of the aspect of application of the photo-curable resin composition to the light-transmitting cover member in Example 4.

FIG. 7 is an explanatory view of an aspect of application of a photo-curable resin composition to a light-transmitting cover member in Comparative Example 1.

FIG. 8 is an explanatory view of an aspect of application of a photo-curable resin composition to a light-transmitting cover member in Comparative Example 2.

FIG. 9 is an explanatory view of an aspect of application of a photo-curable resin composition to a light-transmitting cover member in Comparative Example 3.

DESCRIPTION OF EMBODIMENTS

Each of steps (A) to (D) of a method of manufacturing an image display device of the present invention will be described below in detail by referring to the drawings.

<Step (A) (Application Step)>

First, as shown in FIG. 1A, a light-transmitting cover member 2 is prepared having a light-shielding layer 1 formed on a peripheral part of one surface thereof. Then, as shown in FIG. 1B, a liquid photo-curable resin composition 3 is applied to a light-shielding layer forming surface 2a of the light-transmitting cover member 2 to a thickness greater than that of the light-shielding layer 1 so as to cancel a step 4 formed between the light-shielding layer 1 and the light-shielding layer forming surface 2a of the light-transmitting cover member 2. More specifically, the photo-curable resin composition 3 is applied, to be flattened, on the entire light-shielding layer forming surface 2a of the light-transmitting cover member 2 including a surface of the light-shielding layer 1 so as to avoid generation of a step. Thus, the photo-curable resin composition 3 is applied to a thickness, preferably from 1.2 to 50 times, and more preferably, from twice to 30 times that of the light-shielding layer 1.

The photo-curable resin composition 3 may be applied several times so as to obtain a required thickness.

The light-transmitting cover member 2 is required only to have light-transmitting properties that allow an image formed on an image display member to be recognized visually. A plate-like material and a sheet-like material of glass, acrylic resin, polyethylene terephthalate, polyethylene naphthalate, polycarbonate and the like are applicable. These materials can be subjected to a single-sided or double-sided hard coating treatment and an antireflection treatment, for example. The physical properties of the light-transmitting cover member 2 such as a thickness and elasticity can be determined appropriately according to a purpose of use.

The light-shielding layer 1 is provided to enhance an image contrast, for example, and is formed by applying a coating material colored in black and the like by screen printing process, for example, and then drying and curing the coating material. The light-shielding layer 1 generally has a thickness of from 5 to 100 µm, and this thickness corresponds to the step 4.

The photo-curable resin composition 3 used in this step is in a liquid state. Using the liquid material can cancel the step 4 formed between the light-shielding layer 1 and the light-shielding layer forming surface 2a of the light-transmitting cover member 2. The liquid state mentioned herein means one having a viscosity of from 0.01 to 100 Pa·s (25° C.) as measured with a cone-plate rheometer.

Examples of the photo-curable resin composition 3 may include one containing a photoradical polymerizable poly (meth)acrylate such as a polyurethane-based (meth)acrylate and a polyisoprene-based (meth)acrylate, and a photopolymerization initiator as main components. The term "(meth) acrylate" mentioned herein includes both acrylate and methacrylate.

Specific and preferred examples of the photoradical polymerizable poly(meth)acrylate can include (meth)acrylate-based oligomers having a polyisoprene, polyurethane, or polybutadiene skeleton.

Specific and preferred examples of the (meth)acrylate-based oligomer having a polyisoprene skeleton can include compounds formed by esterification between a maleic anhydride adduct of polyisoprene polymer and 2-hydroxyethyl methacrylate (UC102 (molecular weight of 17,000 in terms of polystyrene), available from KURARAY CO., LTD.; UC203 (molecular weight of 35,000 in terms of polystyrene), available from KURARAY CO., LTD.; and UC-1 (molecular weight of about 25,000 in terms of polystyrene), available from KURARAY CO., LTD.).

Specific and preferred examples of the (meth)acrylate-based oligomer having a polyurethane skeleton can include aliphatic urethane acrylates (EBECRYL230 (molecular weight of 5000), available from DAICEL-CYTEC Company LTD.; and UA-1, available from Light Chemical Industries Co., Ltd.).

One publicly known is applicable as the (meth)acrylate-based oligomer having a polybutadiene skeleton.

A publicly known photoradical polymerization initiator is applicable as the photopolymerization initiator. Examples of the photoradical polymerization initiator can include 1-hydroxy-cyclohexylphenyl ketone (IRGACURE 184, available from Ciba Specialty Chemicals Inc.), 2-hydroxy-1-{4-[4-(2-hydroxy-2-methyl-propionyl)benzyl]-phenyl}-2-methyl-1-propan-1-one (IRGACURE 127, available from Ciba Specialty Chemicals Inc.), benzophenone, and acetophenone.

The aforementioned photopolymerization initiator, if it is too little relative to 100 parts by mass of the photoradical polymerizable poly(meth)acrylate, results in insufficient curing at the time of UV irradiation. If it is too much, output gas is increased due to cleavage to tend to suffer a foaming failure. Thus, the amount of the photopolymerization initiator is preferably from 0.1 to 5 parts by mass, and more preferably from 0.2 to 3 parts by mass.

The liquid photo-curable resin composition 3 can further contain a publicly known plasticizer (flexibility imparting agent) such as terpene-based hydrogenated resins, polybutadiene and polyisoprene having compatibility with the photoradical polymerizable poly(meth)acrylate. These plasticizers are usable as a tackifier as described later.

The photo-curable resin composition 3 can contain a reactive diluent. Preferred examples of the reactive diluent can include 2-hydroxypropyl methacrylate, benzyl acrylate, and dicyclopentenyloxyethyl methacrylate.

The photo-curable resin composition 3 can further contain, if necessary, a general additive such as an adhesion promoter such as a silane coupling agent, and an antioxidant.

The photo-curable resin composition 3 can also contain a chain transfer agent for control of a molecular weight. Examples of the chain transfer agent may include 2-mercaptoethanol, lauryl mercaptan, glycidyl mercaptan, mercaptoacetic acid, 2-ethylhexyl thioglycolate, 2,3-dimethylcapto-1-propanol, and α-methylstyrene dimer.

UV irradiation in the step (B) described later may function to reduce the initial adhesive strength (what is called tackiness) and the eventual adhesive strength of the photo-curable resin composition 3. Thus, it is desirable that a material what is called a tackifier be mixed with the photo-curable resin composition 3. Examples of the applicable tackifier used may include terpene-based resins such as terpene resins, terpene phenol resins, and terpene hydrogenated resins; rosin resins such as natural rosin, polymerized rosin, rosin ester, and hydrogenated rosin; and petroleum resins such as polybutadiene and polyisoprene. The amount of such a tackifier to be added is preferably from 40 to 70 parts by mass with respect to 100 parts by mass of the photo-curable resin composition. The curing level of the photo-curable resin composition 3 tends to increase with a greater quantity of a UV ray applied in the step (B). Thus, it is preferred that the tackifier be mixed more within the aforementioned range.

A base material of the photo-curable resin composition 3 is the aforementioned photoradical polymerizable poly(meth)acrylate. Meanwhile, in order for the tackifier to achieve its adhesion imparting effect more strongly, a material formed in advance by polymerizing the photoradical polymerizable poly(meth)acrylate can be contained. Examples of such a polymerized material can include copolymers of butyl acrylate, 2-hexyl acrylate and acrylic acid, and copolymers of cyclohexyl acrylate and methacrylic acid.

The constituting components of the photo-curable resin composition 3 are as described above. Meanwhile, it is preferred that the photo-curable resin composition 3 include the following components determined by reconsidering the entire constitution while giving particular attention to a plasticizer component. This constitution is applied preferably to the case where a light-shielding plate to shield a UV ray or an attenuation plate to attenuate a UV ray is arranged between a UV source and the applied photo-curable resin composition during UV irradiation (see FIGS. 3A to 3G and 4A to 4F).

The photo-curable resin composition 3 of a preferred constitution suitable for the aforementioned case contains the following components (I) to (IV):

<Component (I)> an acrylate-based oligomer component selected from the group consisting of a polyisoprene-based (meth)acrylate oligomer, a polybutadiene-based (meth)acrylate oligomer, and a polyurethane-based (meth)acrylate oligomer;

<Component (II)> an acrylic monomer component;

<Component (III)> a plasticizer component; and

<Component (IV)> a photopolymerization initiator component;

the total amount of the components (I) and (II) contained in the photo-curable resin composition is from 25 to 80% by mass; the amount of the component (III) contained in the photo-curable resin composition is from 65 to 10% by mass; the component (III) contains a solid tackifier (1) having a softening point of from 60 to 150° C., and a liquid plastic component (2); and the mass ratio between the tackifier (1) and the liquid plastic component (2) falls within a range of 60 to 30:30 to 10. These constituting components are described in detail below.

<Component (I)>

The photo-curable resin composition of the present invention contains an acrylic oligomer component (component (I)) as a photoradical polymerization component in order for a cured material to maintain its properties as a film. In the present invention, at least one type selected from the group consisting of a polyisoprene-based (meth)acrylate oligomer having a polyisoprene skeleton in a main chain, a polybutadiene-based (meth)acrylate oligomer having a polybutadiene skeleton in a main chain, and a polyurethane-based (meth)acrylate oligomer having a polyurethane skeleton in a main chain, is applicable as the aforementioned acrylic oligomer component.

The polyisoprene-based (meth)acrylate oligomer can be one having a molecular weight of preferably from 1,000 to 100,000 as determined by GPC measurement. Specific and preferred examples thereof can include those already described.

The polyurethane-based (meth)acrylate oligomer can be one having a molecular weight of preferably from 1,000 to 100,000 as determined by GPC measurement. Specific and preferred examples thereof can include those already described.

The polybutadiene-based (meth)acrylate based oligomer can be one having a molecular weight of preferably from 1,000 to 100,000 as determined by GPC measurement. Publicly known oligomers are applicable as the polybutadiene based (meth)acrylate oligomer.

<Component (II)>

The photo-curable resin composition of the present invention contains a photoradical polymerizable acrylic monomer component (component II) functioning as a reactive diluent. Specific and preferred examples of the acrylic monomer component can include 2-hydroxypropyl (meth)acrylate, benzyl acrylate, and dicyclopentenyloxyethyl (meth)acrylate already described, and additionally, isobornyl (meth)acrylate and octyl (meth)acrylate.

The total amount of the components (I) and (II) added in the photo-curable resin composition, if it is too small, reduces the properties of a cured material as a film, so that it tends to become a cause of slip after adhesion. The total amount, if it is too large, generates excessive curing, so that it tends to become a cause of deformation of a member. Thus, in order to achieve the effect of the present invention, the total amount is from 25 to 85% by mass, and preferably from 30 to 40% by mass. Regarding the mass ratio between the components (I) and (II), an excessively increased relative mass of the component (I) tends to reduce the interfacial strength of the cured material. Conversely, an excessively reduced relative mass of the component (I) tends to be brittle as the properties of the cured material as a film. Thus, in order to achieve the effect of the present invention, the aforementioned mass ratio is preferably from 1:0.5 to 1:3, and more preferably from 1:1 to 1:2.

<Component (III)>

The photo-curable resin composition of the present invention contains a plasticizer component (component (III)) having compatibility with the acrylic oligomer component being the component (I) and which is also usable as a tackifier. If not having compatibility with the acrylic oligomer component being the component (I), the plasticizer component makes a cured material cloudy to generate the fear of reduction in visibility. Such a plasticizer component contains the solid tackifier (1) and the liquid plastic component (2). The term "solid" mentioned herein means that a softening point is from 60 to 150° C., preferably from 80 to 120° C. according to JIS K5601-2-2. Being liquid means a state exhibiting a viscosity of from 0.01 to 100 Pa·s (25° C.) as measured with a cone-plate rheometer under atmospheric pressure and at 25° C.

The solid tackifier (1) having the aforementioned softening point itself is not photo-cured by UV irradiation. The solid tackifier (1) acts to increase the initial adhesive strength (what is called tackiness) of a cured resin layer or a pre-cured resin layer formed of the photo-curable resin composition, and to increase the eventual adhesive strength of a cured resin layer formed by further curing the pre-cured resin layer completely. Specific examples of the applicable tackifier (1) used can include terpene-based resins such as terpene resins, terpene phenol resins, and terpene hydrogenated resins; rosin resins such as natural rosin, polymerized rosin, rosin ester, and hydrogenated rosin; and petroleum resins such as polybutadiene and polyisoprene. Further, a material prepared in advance by polymerizing the acrylic oligomer component being the component (I) or the acrylate-based monomer component being the component (II) to have a molecular weight of preferably from about 1,000 to about 50,000 can be added within a range not impairing the effect of the present invention. Examples of this polymerized material may include copolymers of butyl acrylate, 2-hexyl acrylate and acrylic acid, and copolymers of cyclohexyl acrylate and methacrylic acid.

The liquid plastic component (2) itself is not photo-cured by UV irradiation. The liquid plastic component (2) imparts flexibility to a cured resin layer or a pre-cured resin layer after photo-curing, and reduces a cure shrinkage between cured resin layers or that of the pre-cured resin layer. The liquid plastic component (2) can be at least one type selected from the group consisting of a liquid polybutadiene-based plasticizer, a polyisoprene-based plasticizer, a phthalate-based plasticizer, and an adipate-based plasticizer.

The mass ratio between the tackifier (1) and the liquid plastic component (2) in the plasticizer component being the component (III) falls within a range of 60 to 30:30 to 10, and preferably, of 60 to 40:20 to 10. In the present invention, if the amount of the solid tackifier (1) is greater than that of the liquid plastic component (2), and particularly if it is within this range, the shape maintaining properties of a cured resin layer after photo-curing and the properties thereof to maintain its adhesive strength can be enhanced.

Generally, a liquid plastic component is contained in a large amount in order to reduce the cure shrinkage of a curable resin composition. In the case of the manufacturing method of the present invention, the curable resin composition is irradiated with a UV ray before it is bonded to an image display member. This advantageously prevents generation of a large cure shrinkage, even if the curable resin composition is photo-cured thereafter. To be specific, the process of the present invention can reduce a cure shrinkage. This can reduce a ratio of the liquid plastic component as compared to a conventional ratio, so that the solid tackifier can be mixed in a larger amount.

The softening point of the tackifier (1) generally has correlation with the molecular weight of the tackifier. Thus, if the tackifier (1) exhibiting a softening point of from 60 to 115° C. among the tackifiers (1) exhibiting a softening point of from 60 to 150° C. is used, the mass ratio between the tackifier (1) and the liquid plastic component (2) is preferably determined to fall within a range of 60 to 40:20 to 10, and more preferably a range of 60 to 50:20 to 10. If a tackifier exhibiting a softening point of from 115 to 150° C. is used, the mass ratio between the tackifier (1) and the liquid plastic component (2) is preferably determined to fall within a range of 50 to 30:30 to 20, and more preferably 50 to 40:30 to 20.

The amount of the plasticizer component being the component (III) contained in the photo-curable resin composition, if it is too little, leads to poor adhesion to tend to generate a failure such as delamination. If it is too much, the resistance to heat of a cured material degrades, generating the fear of a failure such as melting under heat environment. In order to achieve the effect of the present invention, the amount of the plasticizer component is from 65 to 10% by mass, and preferably from 60 to 30% by mass.

<Component (IV)>

The photo-curable resin composition of the present invention contains a photopolymerization initiator component (component (IV)) for photoradically polymerizing photopolymerizable components such as the components (I) and (II).

A publicly known photoradical polymerization initiator is applicable as the photopolymerization initiator being the component (IV), and examples thereof can include those already described.

The amount of the photopolymerization initiator being the component (IV) added in the photo-curable resin composition, if it is too little, results in insufficient curing at the time of UV irradiation. If it is too much, output gas is increased due to cleavage to tend to suffer a foaming failure. Thus, the amount of the photopolymerization initiator is preferably from 0.1 to 5 parts by mass, and more preferably from 0.2 to 3 parts by mass relative to 100 parts by mass of a total of the acrylate-based oligomer being the component (I) and the acrylic monomer component being the component (II).

The photo-curable resin composition of the present invention can contain various additives in addition to the aforementioned components (I) to (IV) within a range not impairing the effect of the present invention. As an example, a chain transfer agent similar to that already described can be mixed for control of the molecular weight of the cured resin. Examples of the chain transfer agent can include those already described. Additionally, general additives such as an adhesion promoter such as a silane coupling agent, and an antioxidant can be contained, where appropriate.

The photo-curable resin composition of the constitution determined while giving particular attention to the plasticizer can be prepared by homogeneously mixing the aforementioned components (I) to (IV) and an additive of each type to be added, where appropriate, according to a publicly known mixing technique.

<Step (B) (Pre-Curing Step)>

Next, as shown in FIG. 1C, the photo-curable resin composition 3 applied in the step (A) is irradiated with a UV ray to be pre-cured, thereby forming a pre-cured resin layer 5. Here, the pre-curing is performed to transfer the photo-curable resin composition 3 from a liquid state to a state where it does not flow remarkably. Thus, the photo-curable resin composition 3 does not drop even if it is turned upside down as shown in FIG. 1D, thereby enhancing handling of the photo-curable resin composition 3. This pre-curing can sufficiently photo-cure a light-transmitting cured resin layer between the light-shielding layer 1 and an image display member without being eliminated from therebetween. This can also reduce cure shrinkage. This pre-curing is at a level that makes the cure rate (gel fraction) of the pre-cured resin layer 5 preferably from 10 to 80%, and more preferably from 30 to 60%.

The cure rate (gel fraction) mentioned herein is a numerical value defined as a ratio (consumption ratio) of the abundance of a (meth)acryloyl group in the photo-curable resin composition 3 after UV irradiation relative to that of the (meth)acryloyl group before the UV irradiation. Increase of this numerical value shows curing proceeds further.

The cure rate (gel fraction) can be calculated by substituting an absorption peak height (X) at from 1640 to 1620 cm$^{-1}$ above a baseline of an FT-IR measurement chart about a resin composition layer before UV irradiation and an absorption peak height (Y) at from 1640 to 1620 cm$^{-1}$ above a baseline of an FT-IR measurement chart about the resin composition layer after the UV irradiation into the following formula (1).

[Formula 1]

$$\text{Cure rate (\%)} = \{(X-Y)/X\} \times 100 \quad (1)$$

Regarding UV irradiation, the type of a light source, output, the accumulated amount of light and the like are not specifically limited as long as the pre-curing can proceed such that the cure rate (gel fraction) becomes preferably from 10 to 80%. Publicly known conditions for photoradical polymerization process on (meth)acrylate by UV irradiation are applicable.

Regarding conditions for UV irradiation, it is preferred that conditions be selected within the aforementioned range of the cure rate that do not generate dripping or deformation of the pre-cured resin layer 5 during bonding operation in the step (C) described later. If expressed in terms of a viscosity, such conditions not generating dripping or deformation are preferably 20 Pa·s or more (as measured with a cone-plate rheometer at 25° C., with a cone/plate C35/2 and a number of revolutions of 10 rpm). The viscosity may be less than 20 Pa·s if the pre-cured resin layer 5 is not turned upside down.

Regarding the conditions for UV irradiation, it is preferred that conditions be selected within the aforementioned range of the cure rate that can maintain stickiness (tackiness) of a surface of the pre-cured resin layer 5 during the bonding operation in the step (C) described later. If expressed in terms of a measured numerical value obtained by a probe tack method (RHESCA method: a method of placing a sample with an adhesive side thereof facing up, pressing a probe against the adhesive side from above, and peeling the probe) using a tacking tester (TAC-1000, available from RHESCA CO., LTD.), such conditions capable of maintaining stickiness are 30 N/cm$^2$ or more. (See "Method of measuring physical properties of adhesive material" in http://www.rhesca.co.jp/main/technical/technical.html.)

<Step (C) (Bonding Step)>

Next, as shown in FIG. 1E, the light-transmitting cover member 2 is bonded to the image display member 6 from a side thereof on which the pre-cured resin layer 5 is formed. This bonding can be performed by applying pressure at from 10° C. to 80° C. by using a publicly known pressure bonding device.

<Step (D) Complete Curing Step)>

Next, as shown in FIG. 1F, the pre-cured resin layer 5 held between the image display member 6 and the light-transmitting cover member 2 is irradiated with a UV ray to be completely cured. If necessary, the pre-cured resin layer 5 between the light-shielding layer 1 of the light-transmitting cover member 2 and the image display member 6 may be irradiated with a UV ray to be completely cured. As a result, the image display member 6 and the light-transmitting cover member 2 are stacked via a light-transmitting cured resin layer 7, thereby obtaining an image display device 10 (FIG. 1G).

Examples of the image display member 6 can include a liquid crystal display panel, an organic EL display panel, a plasma display panel, and a touch panel. The touch panel mentioned herein means an image display and input panel corresponding to a combination of a display element such as a liquid crystal display panel and a position input device such as a touch pad.

The complete curing performed in this step is intended to cure the pre-cured resin layer 5 sufficiently to bond and stack the image display member 6 and the light-transmitting cover member 2. This complete curing is at a level that makes the cure rate (gel fraction) of the light-transmitting cured resin layer 7 preferably 90% or more, and more preferably 95% or more.

The light-transmitting level of the light-transmitting cured resin layer 7 is required only to allow an image formed on the image display member 6 to be recognized visually.

In the example described above by referring to FIGS. 1A to 1G, the photo-curable resin composition is applied to the light-shielding layer forming surface of the light-transmitting cover member. In an example described below by referring to FIGS. 2A to 2F, the photo-curable resin composition is applied to a surface of the image display member. Reference numbers common between FIGS. 1A to 1G and 2A to 2F represent the same constituting elements.

<Step (AA) (Application Step)>

First, as shown in FIG. 2A, a photo-curable resin composition 3 is applied to a surface of an image display member 6 to be flattened. At this time, the photo-curable resin composition 3 is applied to a thickness, preferably from 1.2 times to 50 times, more preferably from twice to 30 times, and further preferably from 2.5 to 4 times that of a light-shielding layer so as to cancel a step formed between the light-shielding layer and a light-shielding layer forming surface of a light-transmitting cover member in a step (CC) described below.

The photo-curable resin composition 3 may be applied several times so as to obtain a required thickness.

<Step (BB) (Pre-Curing Step)>

Next, as shown in FIG. 2B, the photo-curable resin composition 3 applied in the step (AA) is irradiated with a UV ray to be pre-cured, thereby forming a pre-cured resin layer 5 (FIG. 2C). Here, the pre-curing is performed to transfer the photo-curable resin composition 3 from a liquid state to a state where it does not flow remarkably, thereby enhancing handling of the photo-curable resin composition 3. The pre-curing is also performed to depress the photo-curable resin composition 3 to an extent that can cancel the step of the light-shielding layer when the light-shielding layer of the light-transmitting cover member is placed from above. This pre-curing can sufficiently photo-cure a light-transmitting cured resin layer between the light-shielding layer and the image display member without eliminating the resin layer from therebetween, and can also suppress cure shrinkage. This pre-curing is at a level that makes the cure rate (gel fraction) of the pre-cured resin layer 5 preferably from 10 to 80%, and more preferably from 30 to 60%.

<Step (CC) (Bonding Step)>

Next, as shown in FIG. 2D, a light-transmitting cover member 2 is bonded to the pre-cured resin layer 5 on the image display member 6 from a side thereof on which the light-shielding layer 1 is formed. This bonding can be performed by applying pressure at from 10° C. to 80° C. by using a publicly known pressure bonding device.

<Step (DD) Complete Curing Step)>

Next, as shown in FIG. 2E, the pre-cured resin layer 5 held between the image display member 6 and the light-transmitting cover member 2 is irradiated with a UV ray to be completely cured. If necessary, the pre-cured resin layer 5 between the light-shielding layer 1 of the light-transmitting cover member 2 and the image display member 6 may be irradiated with a UV ray to be completely cured. As a result, the image display member 6 and the light-transmitting cover member 2 are stacked via a light-transmitting cured resin layer 7, thereby obtaining an image display device 10 (FIG. 2F).

Examples of the image display member 6 can include a liquid crystal display panel, an organic EL display panel, a plasma display panel, and a touch panel.

The complete curing performed in this step is at a level that makes the cure rate (gel fraction) of the light-transmitting cured resin layer 7 preferably 90% or more, and more preferably 95% or more.

The light-transmitting level of the light-transmitting cured resin layer 7 is required only to allow an image formed on the image display member 6 to be recognized visually.

In the examples described above by referring to FIGS. 1A to 1G and FIGS. 2A to 2F, the photo-curable resin composition is applied to the light-shielding layer forming surface of the light-transmitting cover member or the surface of the image display member, and the applied photo-curable resin composition is entirely irradiated with a UV ray to be pre-cured. In examples described below by referring to FIGS. 3A to 3G and FIGS. 4A to 4F, a UV ray is applied while a shielding plate or an attenuation plate to shield or attenuate a UV ray is arranged between a UV source and the applied photo-curable resin composition. Reference numbers common between these drawings represent the same constituting elements.

An aspect of FIGS. 3A to 3G will be described first. In this aspect, a photo-curable resin composition is applied to a surface of a light-transmitting cover member.

<Step (a) (Application Step)>

First, as shown in FIG. 3A, a light-transmitting cover member 2 having a light-shielding layer 1 formed on a peripheral part of one surface thereof is prepared. Then, as shown in FIG. 3B, a liquid photo-curable resin composition 3 is applied to a light-shielding layer forming surface 2a of the light-transmitting cover member 2 to a thickness greater than that of the light-shielding layer 1 so as to cancel a step 4 formed between the light-shielding layer 1 and the light-shielding layer forming surface 2a of the light-transmitting cover member 2. More specifically, the photo-curable resin composition 3 is applied on the entire light-shielding layer forming surface 2a of the light-transmitting cover member 2 including a surface of the light-shielding layer 1 to be flattened so as to avoid generation of a step. Thus, the photo-curable resin composition 3 is applied to a thickness, preferably from 1.2 to 12.5 times, and more preferably from 2.5 to 4 times that of the light-shielding layer 1.

The photo-curable resin composition 3 may be applied several times so as to obtain a required thickness.

<Step (b) (Pre-Curing Step)>

Next, as shown in FIG. 3C, at least part of the photo-curable resin composition 3 existing on the light-shielding layer 1 is irradiated with a UV ray to be pre-cured, so that the cure rate of a pre-cured resin layer 5a on the light-shielding layer 1 can be increased. Here, at least the part of the photo-curable resin composition 3 existing on the light-shielding layer 1 is pre-cured while it is transferred from a liquid state to a state where it does not flow remarkably. This is because the drop of the photo-curable resin composition 3 is prevented even if it is turned upside down as shown in FIG. 3D to enhance handling of the photo-curable resin composition 3, and at the same time, the step between the light-shielding layer 1 and the light-shielding layer forming surface of the light-transmitting cover member 2 is cancelled. Pre-curing the outer periphery of the applied region is also intended to maintain the shape of application, thereby enhancing a cured state in advance above the light-shielding layer 1 where UV irradiation is difficult.

As shown in FIG. 3C, this pre-curing can be realized by disposing, between a UV source and the applied photo-curable resin composition 3, an attenuation plate 20 to attenuate a UV ray and then applying a UV ray. Examples of the attenuation plate 20 can include a quartz plate member with fine concave and convex portions formed on a surface thereof. A UV ray to enter the attenuation plate 20 first reflects diffusely at the surface concave and convex portions, and then attenuates inside the plate member. The level of the surface concave and convex portions is required only to have a size or a shape that generates diffused reflection.

The pre-curing can also be performed with a shielding plate to shield light instead of the attenuation plate 20. In this case, a peripheral part of a panel may be exposed while a main surface part of the panel may be shielded by the shielding plate. The shielding plate may be disposed in a partial period within a duration of UV irradiation.

The cure rate (gel fraction) of the pre-cured resin layer 5a on the light-shielding layer 1 is set to a level of preferably from 30 to 80%, and more preferably from 40 to 70%. This can completely cure a light-transmitting cured resin layer 7 on the light-shielding layer 1 when the light-transmitting cured resin layer 7 on the light-transmitting cover member 2 corresponding to the main surface part of the panel is completely cured in a complete curing step corresponding to a step (d) described later. The complete curing mentioned herein means a cured state of the cure rate being at least 90% as described above.

The cure rate (gel fraction) of the pre-cured resin layer 5b on the surface of the light-transmitting cover member 2 is preferably from 0 to 80%, and more preferably from 20 to 70%. The cure rate of the pre-cured resin layer exceeding 80% tends to generate interfacial delamination easily to worsen an adhesive state.

In order for the resin composition not to be eliminated from between the light-shielding layer 1 and the light-transmitting cover member 2, it is preferred that the cure rate of the pre-cured resin layer 5a on the light-shielding layer 1 be higher than that of the pre-cured resin layer 5b on the surface of the light-transmitting cover member 2.

The cure rate (gel fraction) can be calculated in the manner already described. Conditions for UV irradiation, the viscosity, tackiness and the like of the pre-cured resin, can be the same as those already described.

<Step (c) (Bonding Step)>

Next, as shown in FIG. 3E, the light-transmitting cover member 2 is bonded to the image display member 6 from a side thereof on which the pre-cured resin layer 5 is formed.

This bonding can be performed by applying pressure at from 10° C. to 80° C. by using a publicly known pressure bonding device.

<Step (d) Complete Curing Step>

Next, as shown in FIG. 3F, the pre-cured resin layer 5 held between the image display member 6 and the light-transmitting cover member 2 is irradiated with a UV ray to be completely cured. If necessary, the pre-cured resin layer 5 between the light-shielding layer 1 of the light-transmitting cover member 2 and the image display member 6 may be irradiated with a UV ray to be completely cured. As a result, the image display member 6 and the light-transmitting cover member 2 are stacked via the light-transmitting cured resin layer 7, thereby obtaining an image display device 10 (FIG. 3G).

Examples of the image display member 6 can include a liquid crystal display panel, an organic EL display panel, a plasma display panel, and a touch panel. The touch panel mentioned herein means an image display and input panel corresponding to a combination of a display element such as a liquid crystal display panel and a position input device such as a touch pad.

The complete curing performed in this step is intended to cure the pre-cured resin layer 5 sufficiently to bond and stack the image display member 6 and the light-transmitting cover member 2. This complete curing is at a level that makes the cure rate (gel fraction) of the light-transmitting cured resin layer 7 preferably 90% or more, and more preferably 95% or more.

The light-transmitting level of the light-transmitting cured resin layer 7 is required only to allow an image formed on the image display member 6 to be recognized visually.

An aspect of FIGS. 4A to 4F will be described first. In this aspect, a photo-curable resin composition is applied to a surface of an image display member.

<Step (aa) (Application Step)>

First, as shown in FIG. 4A, a photo-curable resin composition 3 is applied to be flattened on a surface of an image display member 6. At this time, the photo-curable resin composition 3 is applied to a thickness, preferably from 1.2 to 12.5 times, and more preferably from 2.5 to 4 times that of a light-shielding layer so as to cancel a step formed between the light-shielding layer and a light-shielding layer forming surface of a light-transmitting cover member in a step (cc) described below.

The photo-curable resin composition 3 may be applied several times so as to obtain a required thickness.

<Step (bb) (Pre-Curing Step)>

Next, as shown in FIG. 4B, at least part of the photo-curable resin composition 3 existing on the light-shielding layer 1 is irradiated with a UV ray to be pre-cured, thereby forming a pre-cured resin layer 5a (FIG. 4C). Here, at least the part of the photo-curable resin composition 3 existing on the light-shielding layer 1 is pre-cured while it is transferred from a liquid state to a state where it does not flow remarkably. This is because a step between the light-shielding layer 1 and the light-shielding layer forming surface of the light-transmitting cover member 2 is cancelled. Pre-curing the outer periphery of the applied region is also intended to maintain the shape of application, thereby enhancing a cured state in advance above the light-shielding layer 1 where UV irradiation is difficult.

As shown in FIG. 4B, this pre-curing can be realized by providing an attenuation plate 20 to attenuate a UV ray between an UV source and the applied photo-curable resin composition 3 and then applying a UV ray. A shielding plate to shield light can replace the attenuation plate 20. In this case, a peripheral part of a panel may be exposed while a main surface part of the panel may be shielded by the shielding plate. The shielding plate may be arranged in a partial period within a duration of UV irradiation.

The cure rate (gel fraction) of the pre-cured resin layer 5a on the light-shielding layer 1 is at a level of preferably from 30 to 80%, and more preferably from 40 to 70%. This can completely cure a light-transmitting cured resin layer 7 on the light-shielding layer 1 when the light-transmitting cured resin layer 7 on the light-transmitting cover member 2 corresponding to the main surface part of the panel is completely cured in a complete curing step corresponding to a step (dd) described later. The complete curing mentioned herein means a cured state of the cure rate being at least 90% as described above.

The cure rate (gel fraction) of the pre-cured resin layer 5b on the surface of the light-transmitting cover member 2 is preferably from 0 to 80%, and more preferably from 20 to 70%. The cure rate of the pre-cured resin layer exceeding 80% tends to generate interfacial delamination easily to worsen an adhesive state.

In order for the resin composition not to be eliminated from between the light-shielding layer 1 and the light-transmitting cover member 2, it is preferred that the cure rate of the pre-cured resin layer 5a on the light-shielding layer 1 be higher than that of the pre-cured resin layer 5b on the surface of the light-transmitting cover member 2.

The cure rate (gel fraction) can be calculated in the manner already described. Conditions for UV irradiation, the viscosity, tackiness and the like of the pre-cured resin, can be the same as those already described.

<Step (cc) (Bonding Step)>

Next, as shown in FIG. 4D, the light-transmitting cover member 2 is bonded to the image display member 6 from a side thereof on which the pre-cured resin layer 5 is formed. This bonding can be performed by applying pressure at from 10° C. to 80° C. by using a publicly known pressure bonding device.

<Step (dd) Complete Curing Step>

Next, as shown in FIG. 4E, the pre-cured resin layer 5 held between the image display member 6 and the light-transmitting cover member 2 is irradiated with a UV ray to be completely cured. If necessary, the pre-cured resin layer 5 between the light-shielding layer 1 of the light-transmitting cover member 2 and the image display member 6 may be irradiated with a UV ray to be completely cured. As a result, the image display member 6 and the light-transmitting cover member 2 are stacked via the light-transmitting cured resin layer 7, thereby obtaining an image display device 10 (FIG. 4F).

Examples of the image display member 6 can include a liquid crystal display panel, an organic EL display panel, a plasma display panel, and a touch panel. The touch panel mentioned herein means an image display and input panel corresponding to a combination of a display element such as a liquid crystal display panel and a position input device such as a touch pad.

The complete curing performed in this step is intended to cure the pre-cured resin layer 5 sufficiently to bond and stack the image display member 6 and the light-transmitting cover member 2. This complete curing is at a level that makes the cure rate (gel fraction) of the light-transmitting cured resin layer 7 preferably 90% or more, and more preferably 95% or more.

The light-transmitting level of the light-transmitting cured resin layer 7 is required only to allow an image formed on the image display member 6 to be recognized visually.

As described above, according to the manufacturing method of the present invention, a liquid photo-curable resin composition is applied to a surface of a light-transmitting cover member including a light-shielding layer or a surface of an image display member to a thickness greater than that of the light-shielding layer. Then, the photo-curable resin composition is irradiated with a UV ray to be pre-cured, thereby forming a pre-cured resin layer at least on the light-shielding layer. Next, the image display member and the light-transmitting cover member are stacked via the pre-cured resin layer and thereafter, the pre-cured resin layer is irradiated with a UV ray to be completely cured, thereby forming a light-transmitting cured resin layer. Thus, even without performing heat polymerization process, the light-transmitting cured resin layer between the light-shielding layer and the image display member is photo-cured sufficiently without being eliminated from therebetween irrespective of whether the light-transmitting cured resin layer exists on the light-shielding layer or the surface of the light-transmitting cover member. Further, a step between the light-shielding layer and a light-shielding layer forming surface of the light-transmitting cover member can be canceled.

EXAMPLES

The present invention will be described in more detail below by means of Examples of the present invention.

Example 1

(Step (A) (Application Step))

First, a glass plate of a size of 45 mm (w)×80 mm (1)×0.4 mm (t) was prepared. Next, a light-shielding layer of a width of 4 mm was applied to a thickness of 40 μm in a dry state to the entire peripheral part of the glass plate by screen printing process using a thermosetting black ink (MRX ink, available from Teikoku Printing Inks Mfg. Co., Ltd.) and then dried, thereby preparing a glass plate with a light-shielding layer.

Next, a photo-curable resin composition was prepared by homogeneously mixing 6 parts by mass of polyisoprene methacrylate (UC102, available from KURARAY CO., LTD.) as a photoradical polymerizable poly(meth)acrylate, 15 parts by mass of dicyclopentenyloxyethyl methacrylate and 5 parts by mass of lauryl methacrylate as a reactive diluent, 20 parts by mass of polybutadiene (Polyvest 110, available from Evonik Degussa GmbH) as a plasticizer, 1 part by mass of a photopolymerization initiator (Irgacure 184, available from BASF), and 53 parts by mass of a hydrogenated terpene resin (Clearon M105, available from YASUHARA CHEMICAL CO., LTD.) as a tackifier. The viscosity of the photo-curable resin composition was about 6,000 mPa·s (as measured with a cone-plate rheometer at 25° C., with a cone/plate C35/2 and a number of revolutions of 10 rpm).

Next, the photo-curable resin composition was discharged with a resin dispenser on the entire light-shielding layer forming surface of the glass plate with a light-shielding layer, thereby forming a photo-curable resin composition film of an average of about 200 μm. As shown in FIG. 1B, the photo-curable resin composition film was formed to cover the substantially entire light-shielding layer, and was formed to be greater in thickness by about 160 μm than the light-shielding layer of a thickness of 40 μm.

(Step (B) (Pre-Curing Step))

Next, the photo-curable resin composition film was irradiated with a UV ray of an intensity of 50 mW/cm$^2$ for six seconds by using a UV irradiation device (LC-8, available from Hamamatsu Photonics K.K.) so as to achieve an integrated light quantity of 300 mJ/cm$^2$, thereby pre-curing the photo-curable resin composition film to form a pre-cured resin layer. The integrated light quantity of 300 mJ/cm$^2$ mentioned herein corresponds to about 10% of the quantity of a UV ray required for completely curing the photo-curable resin composition film.

The cure rate of the photo-curable resin composition film after the UV irradiation, specifically of the pre-cured resin layer, was determined by using, as an index, an absorption peak height at from 1640 to 1620 cm$^{-1}$ above a baseline of an FT-IR measurement chart, and was about 50%.

The viscosity of the pre-cured resin layer was 30 Pa·s (as measured with a cone-plate rheometer at 25° C., with a cone/plate C35/2 and a number of revolutions of 10 rpm). Thus, inverting the glass plate to place the pre-cured resin layer of the glass plate downside did not generate dripping or deformation within one minute.

Further, the tackiness of a surface of the pre-cured resin layer was measured by the probe tack method using a tacking tester (TAC-II, available from RHESCA CO., LTD.), and was 90 N/cm$^2$.

(Step (C) (Bonding Step))

Next, the glass plate obtained in the step (B) was placed on a surface of a liquid crystal display element of a size of 40 mm (W)×70 mm (L) on which a polarizing plate was stacked such that a side of the glass plate with the pre-cured resin layer faced the polarizing plate. Then, pressure was applied with a rubber roller from the side of the glass plate to bond the glass plate. The liquid crystal display element was visually observed from the side of the glass plate while the glass plate was bonded. As a result, air bubbles were not observed around the light-shielding layer.

(Step (D) (Complete Curing Step))

Next, the liquid crystal display element was irradiated with a UV ray (50 mW/cm$^2$) for 60 seconds from the side of the glass plate by using a UV irradiation device (LC-8, available from Hamamatsu Photonics K.K.) to completely cure the pre-cured resin layer, thereby forming a light-transmitting cured resin layer. The cure rate of the light-transmitting cured resin layer was 97%. As a result, a liquid crystal display device was obtained where the glass plate as a light-transmitting cover member was stacked on the liquid crystal display element via the light-transmitting cured resin layer.

<Evaluations>

The presence or absence of air bubbles at a boundary of the light-shielding layer with the photo-curable resin composition film, the pre-cured resin layer or the light-transmitting cured resin layer in a resultant in each step of Example 1 was observed visually in a manner described below. Further, the adhesive state of the liquid crystal display device was evaluated in a manner described below. Results of Examples 1 to 5 and Comparative Examples 1 to 5 are summarized in Table 1.

(Presence or Absence of Air Bubbles)

The presence or absence of air bubbles at the boundary of the light-shielding layer with the photo-curable resin composition film, the pre-cured resin layer or the light-transmitting cured resin layer in the resultant in each step was observed visually. As a result, air bubbles were not observed in the resultants in all the steps and the finished liquid crystal display device.

(Evaluation of Adhesive State)

As shown in FIG. 5, during formation of the liquid crystal display device, a bonded glass structure was obtained by using a glass base 30 of a size of 40 mm (W)×70 mm (L) in place of the liquid crystal display element, and bonding a glass plate 31 including a pre-cured resin layer formed thereon to the glass base 30 at right angles from a side thereof on which the pre-cured resin layer was formed. While the glass base 30 placed below the glass plate 31 was fixed, the glass plate 31 placed above was peeled directly upward. Resultant delamination properties were observed visually and an adhesive state was evaluated according to the following criteria. As a result, the adhesive state was evaluated as "A."

Ranks Criteria

A: Cohesive delamination was generated.

B: Both cohesive delamination and interfacial delamination were generated.

C: Interfacial delamination was generated.

Example 2

A liquid crystal display device and a bonded glass structure for adhesive strength measurement were formed in the same manner as in Example 1, except that the photo-curable resin composition film was formed to cover about 70% of the width of the light-shielding layer in the step (A) (application step) of Example 1. Then, the presence or absence of air bubbles was observed, and an adhesive state was evaluated. As a result, even if the photo-curable resin composition film was formed to cover only about 70% of the width of the light-shielding layer, air bubbles were not present in resultants in all the steps and the finished liquid crystal display device of Example 2, and the adhesive state was evaluated as A. This is considered to be by virtue of the fact that the pre-cured resin layer expanded to cover the entire light-shielding layer in the step (C) (bonding step).

Example 3

A liquid crystal display device and a bonded glass structure for adhesive strength measurement were formed in the same manner as in Example 1, except that the photo-curable resin composition film was formed to a thickness of about 1.2 times that of the light-shielding layer in the step (A) (application step) of Example 1. Then, the presence or absence of air bubbles was observed, and an adhesive state was evaluated. As a result, by forming the photo-curable resin composition film to a thickness of about 1.2 times that of the light-shielding layer, air bubbles were not present in resultants in all the steps and the finished liquid crystal display device of Example 3, and the adhesive state was evaluated as "A."

Example 4

A liquid crystal display device and a bonded glass structure for adhesive strength measurement were formed in the same manner as in Example 1, except that a photo-curable resin composition 3a was applied to the same thickness as that of the light-shielding layer 1 not to cover the light-shielding layer 1 as shown in FIG. 6A, and thereafter a photo-curable resin composition 3b was applied to cover the light-shielding layer 1 as shown in FIG. 6B in the step (A) (application step) of Example 1. Then, the presence or absence of air bubbles was observed, and an adhesive state was evaluated. As a result, even if the photo-curable resin composition has multiple layers, air bubbles were not present in resultants in all the steps and the finished liquid crystal display device of Example 4, and the adhesive state was evaluated as "A."

Example 6

A liquid crystal display device and a bonded glass structure for adhesive strength measurement were formed in the same manner as in Example 1, except that the cure rate of the pre-cured resin layer was set to be 10%, 30%, 60% and 80% in the step (B) of Example 1, and that a UV ray was irradiated until the cure rate of the pre-cured resin layer of 99% or more was achieved in the step (D). Then, the presence or absence of air bubbles was observed, and an adhesive state was evaluated. As a result, even if the cure rate of the pre-cured resin layer changes in a range of from 10% to 80%, air bubbles were not present in resultants in all the steps and the finished liquid crystal display device of Example 5. Further, the adhesive state was evaluated as "A," except for the case of 80% (evaluated as "B").

The tackiness of a surface of the pre-cured resin layer was measured by the probe tack method using a tacking tester (TAC-II, available from RHESCA CO., LTD.), and was confirmed to fall within a range of from 30 to 120 N/cm$^2$.

Comparative Example 1

A liquid crystal display device and a bonded glass structure for adhesive strength measurement were formed in the same manner as in Example 1, except that the photo-curable resin composition 3 was formed to cover the entire light-shielding layer 1 while it was formed to a thickness of about 30 μm smaller than that of the light-shielding layer 1 in the step (A) (application step) of Example 1, as shown in FIG. 7. Then, the presence or absence of air bubbles was observed, and an adhesive state was evaluated. As a result, air bubbles were not observed in a resultant in the step (A), whereas air bubbles were observed in a resultant in the step (C) and a resultant in the step (D) (liquid crystal display device). The adhesive state was evaluated as "A."

Comparative Example 2

A liquid crystal display device and a bonded glass structure for adhesive strength measurement were formed in the same manner as in Example 1, except that the photo-curable resin composition 3 was formed as dots to a height greater than that of the light-shielding layer 1 so as not to cover the light-shielding layer 1 in the step (A) (application step) of Example 1, as shown in FIG. 8. Then, the presence or absence of air bubbles was observed, and an adhesive state was evaluated. UV irradiation clearly catches air bubbles, so that the glass plate was bonded to the liquid crystal display device without UV irradiation. As a result, air bubbles were observed in every region not limited to the surrounding of the light-shielding layer. The adhesive state was evaluated as "A."

Comparative Example 3

A liquid crystal display device and a bonded glass structure for adhesive strength measurement were formed in the same manner as in Example 1, except that the photo-curable resin composition 3 was formed not to cover the light-shielding layer 1 and to a thickness smaller than that of the light-shielding layer 1 in the step (A) (application step) of Example 1, as shown in FIG. 9. Then, the presence or absence of air bubbles was observed, and an adhesive state was evaluated. As a result, air bubbles were not observed in a resultant in the step (A), whereas air bubbles were observed in a resultant in the bonding step of the step (C) and a resultant in the step (D) (complete curing step) (liquid crystal display device). The adhesive state was evaluated as "A."

Comparative Example 4

A liquid crystal display device and a bonded glass structure for adhesive strength measurement were formed in the same manner as in Example 1, except that the cure rate of the pre-cured resin layer was set to be 90% in the step (B) (pre-curing step) of Example 1, and that a UV ray was irradiated for 30 seconds in the step (D) (complete curing step). Then, the presence or absence of air bubbles was observed, and an adhesive state was evaluated. As a result, air bubbles were not present in resultants in all the steps, whereas the adhesive state was evaluated as "C."

Comparative Example 5

A liquid crystal display device and a bonded glass structure for adhesive strength measurement were formed in the same manner as in Example 1, except that the photo-curable resin composition was not applied to the glass plate but formed on a release film in the step (A) of Example 1, a pre-cured resin layer was formed from the photo-curable resin composition on the release film by the same UV irradiation as that of the step (B) of Example 1, and the pre-cured resin layer was transferred to a glass plate including a light-shielding layer formed thereon. Then, the presence or absence of air bubbles was observed, and an adhesive state was evaluated. As a result, air bubbles were observed at a step of the light-shielding layer during transfer of the pre-cured resin layer. Air bubbles were also observed in resultants in the subsequent steps (C) and (D). The adhesive state was evaluated as "B."

dicyclopentenyloxyethyl methacrylate (FA512M, available from Hitachi Chemical Co., Ltd.), 3 parts by mass of hydroxypropyl methacrylate (HPMA, available from Nippon Kasei Chemical Co., Ltd.), 15 parts by mass of tetrahydrofurfryl acrylate (LIGHT ESTER THF, available from KYOEISHA CHEMICAL Co., LTD.), 5 parts by mass of lauryl methacrylate (LIGHT ESTER L, available from KYOEISHA CHEMICAL Co., LTD.), 20 parts by mass of a polybutadiene polymer (Polyvest 110, available from Evonik Degussa GmbH), 45 parts by mass of a hydrogenated terpene resin (P85, available from YASUHARA CHEMICAL CO., LTD.), and 4 parts by mass of a photopolymerization initiator (Irgacure 184, available from BASF). This photo-curable resin composition exhibited a total cure shrinkage of 3.4% under a cure rate of from 0 to 90%. The viscosity of the photo-curable resin composition was about 6,000 mPa·s (as measured with a cone-plate rheometer at 25° C., with a cone/plate C35/2 and a number of revolutions of 10 rpm).

Next, the photo-curable resin composition was discharged with a resin dispenser on the entire light-shielding layer forming surface of the glass plate with a light-shielding layer, thereby forming a photo-curable resin composition film of an average of about 200 μm. As shown in FIG. 3B, the photo-curable resin composition film was formed to cover the substantially entire light-shielding layer, and was formed to be greater in thickness by about 160 μm than the light-shielding layer of a thickness of 40 μm.

(Step (b) (Pre-Curing Step))

Next, a shielding plate to shield a UV ray is disposed between a UV source and the photo-curable resin composition. Then, the photo-curable resin composition film was pre-cured by using a UV irradiation device (LC-8, available from Hamamatsu Photonics K.K.), thereby forming a pre-cured resin layer. The cure rate of the photo-curable resin composition film after the UV irradiation, specifically of the pre-cured resin layer, was determined by using, as an index, an absorption peak height at from 1640 to 1620 cm$^{-1}$ above a baseline of an FT-IR measurement chart, and was about

TABLE 1

| | EXAMPLE | | | | | COMPARATIVE EXAMPLE | | | | |
|---|---|---|---|---|---|---|---|---|---|---|
| | 1 | 2 | 3 | 4 | 5 | 1 | 2 | 3 | 4 | 5 |
| Presence or Absence of Air Bubbles | Absent | Absent | Absent | Absent | Absent | Present | Present | Present | Absent | Present |
| Evaluation of Adhesive State | A | A | A | A | A | A | A | A | C | B |

Example 6

(Step (a) (Application Step))

First, a glass plate of a size of 45 mm (w)×80 mm (1)×0.4 mm (t) was prepared. Next, a light-shielding layer of a width of 4 mm was applied to a thickness of 40 μm in a dry state to the entire peripheral part of the glass plate by screen printing process using a thermosetting black ink (MRX ink, available from Teikoku Printing Inks Mfg. Co., Ltd.) and then dried, thereby preparing a glass plate with a light-shielding layer.

Next, a photo-curable resin composition was prepared by homogeneously mixing 40 parts by mass of an acrylate-based oligomer having a polyisoprene skeleton (UC203, available from KURARAY CO., LTD.), 20 parts by mass of 30% on the light-shielding layer and about 0% on a surface of a light-transmitting cover member.

(Step (c) (Bonding Step))

Next, the glass plate obtained in the step (b) was placed on a surface of a liquid crystal display element of a size of 40 mm (W)×70 mm (L) on which a polarizing plate was stacked such that a side of the glass plate with the pre-cured resin layer faced the polarizing plate. Then, pressure was applied with a rubber roller from the side of the glass plate to bond the glass plate. The liquid crystal display element was visually observed from the side of the glass plate while the glass plate was bonded. As a result, air bubbles were not observed around the light-shielding layer.

(Step (d) (Complete Curing Step))

Next, the liquid crystal display element was irradiated with a UV ray (50 mW/cm$^2$) from the side of the glass plate by using a UV irradiation device (LC-8, available from Hamamatsu Photonics K.K.) to cure the photo-curable resin composition on the light-transmitting cover member to a cure rate of 95% or more, thereby forming a light-transmitting cured resin layer. The cure rate of the light-transmitting cured resin layer on the light-shielding layer was about 90%. As a result, a liquid crystal display device was obtained where the glass plate as the light-transmitting cover member was stacked on the liquid crystal display element via the light-transmitting cured resin layer.

<Evaluations>

As described below, the presence or absence of elimination of the photo-curable resin composition from between the light-shielding layer and the image display member in each step of Example 6 was evaluated in a manner described below. Further, the adhesive state of the liquid crystal display device was evaluated in a manner described below. Results of Examples 6 to 9 and Comparative Examples 6 and 7 are summarized in Table 2.

(Presence or Absence of Elimination of Photo-Curable Resin Composition from Between Light-Shielding Layer and Image Display Member)

The presence or absence of elimination of the photo-curable resin composition from between the light-shielding layer and the image display member in a resultant in each step of Example 6 was observed visually. As a result, elimination of the photo-curable resin composition was not observed in the resultants in all the steps and the finished liquid crystal display device.

(Evaluation of Adhesive State)

As in Example 1, during formation of the liquid crystal display device, a bonded glass structure was obtained by using a glass base 30 of a size of 40 mm (W)×70 mm (L) in place of the liquid crystal display element, and bonding a glass plate 31 including a pre-cured resin layer formed thereon to the glass base 30 at right angles from a side thereof on which the pre-cured resin layer was formed, as shown in FIG. 5. While the glass base 30 placed below the glass plate 31 was fixed, the glass plate 31 placed above was peeled directly upward. Resultant delamination properties were observed visually and an adhesive state was evaluated according to the same criteria as those of Example 1. As a result, the adhesive state was evaluated as "A."

Example 7

A liquid crystal display device and a bonded glass structure for adhesive strength measurement were formed in the same manner as in Example 6, except that a UV ray was applied to make the cure rate of the pre-cured resin layer on the light-shielding layer about 50% in the step (b) (pre-curing step) of Example 6. As a result, the cure rate of the light-transmitting cured resin layer on the light-shielding layer was about 95%, and elimination of the photo-curable resin composition was not observed in resultants in all the steps and the finished liquid crystal display device. Further, the adhesive state was evaluated as "A."

Example 8

A liquid crystal display device and a bonded glass structure for adhesive strength measurement were formed in the same manner as in Example 6, except that a UV ray was applied to make the cure rate of the pre-cured resin layer on the light-shielding layer about 70% in the step (b) (pre-curing step) of Example 6. As a result, the cure rate of the light-transmitting cured resin layer on the light-shielding layer was about 95%, and elimination of the photo-curable resin composition was not observed in resultants in all the steps and the finished liquid crystal display device. Further, the adhesive state was evaluated as "A."

Example 9

A liquid crystal display device and a bonded glass structure for adhesive strength measurement were formed in the same manner as in Example 6, except that a UV ray was applied to make the cure rate of the pre-cured resin layer on the light-shielding layer about 80% in the step (b) (pre-curing step) of Example 6. As a result, the cure rate of the light-transmitting cured resin layer on the light-shielding layer was about 95%, and elimination of the photo-curable resin composition was not observed in resultants of all the steps and the finished liquid crystal display device. Further, the adhesive state was evaluated as "B."

Comparative Example 6

A liquid crystal display device and a bonded glass structure for adhesive strength measurement were formed in the same manner as in Example 6, except that a UV ray was applied to make the cure rate of the pre-cured resin layer on the light-shielding layer about 90% in the step (b) (pre-curing step) of Example 6. As a result, the cure rate of the light-transmitting cured resin layer on the light-shielding layer was about 95%, and elimination of the photo-curable resin composition was not observed in resultants in all the steps and the finished liquid crystal display device. Meanwhile, the adhesive state was evaluated as "C."

Comparative Example 7

A liquid crystal display device and a bonded glass structure for adhesive strength measurement were formed in the same manner as in Example 6, except that a UV ray was applied make the cure rate of the pre-cured resin layer on the light-shielding layer about 10% in the step (b) (pre-curing step) of Example 6. As a result, the cure rate of the light-transmitting cured resin layer on the light-shielding layer was about 80%, and elimination of the photo-curable resin composition was observed in the step (d) (complete curing step). Meanwhile, the adhesive state was evaluated as "A."

TABLE 2

| | | Example | | | | Comparative Example | |
|---|---|---|---|---|---|---|---|
| | | 6 | 7 | 8 | 9 | 6 | 7 |
| Cure Rate of Pre-cured Resin Layer (%) | Position on Light-shielding Layer | 30 | 50 | 70 | 80 | 90 | 10 |
| | Position on Cover Member | 0 | 0 | 0 | 0 | 0 | 0 |

TABLE 2-continued

| | | Example | | | | Comparative Example | |
|---|---|---|---|---|---|---|---|
| | | 6 | 7 | 8 | 9 | 6 | 7 |
| Cure Rate of Cured Resin Layer (%) | Position on Light-shielding Layer | 90 | 95 | 95 | 95 | 95 | 80 |
| | Position on Cover Member | 95≤ | 95≤ | 95≤ | 95≤ | 95≤ | 95≤ |
| Presence or Absence of Elimination of Photo-curable Resin Composition | | Absent | Absent | Absent | Absent | Absent | Present |
| Evaluation of Adhesive State | | A | A | A | B | C | A |

In the case of Comparative Example 6 shown in Table 2, interfacial delamination was generated in the cured resin layer on the light-shielding layer when the cure rate of the pre-cured resin layer on the light-shielding layer was made to be about 90% in the step (b) (pre-curing step). Thus, the adhesive state was evaluated as "C."

In the case of Comparative Example 7 shown in Table 2, complete curing of a cure rate of 90% or more could not be achieved on the entire light-shielding layer and the entire light-transmitting cover member in the step (d) (complete curing step) when the cure rate of the pre-cured resin layer on the light-shielding layer was made to be about 10% in the step (b) (pre-curing step). Hence, elimination of the photo-curable resin composition was generated.

In contrast, in the cases of Examples 6 to 9, by making the cure rate of the pre-cured resin layer on the light-shielding layer from 30 to 80% in the step (b) (pre-curing step), complete curing of a cure rate of 90% or more could be achieved on the entire light-shielding layer and the entire light-transmitting cover member in the step (d) (complete curing step). As a result, elimination of the photo-curable resin composition was not observed, and the adhesive state was evaluated as A or B.

Example 10

In the step (b) of Example 6, a quartz UV attenuation plate with fine convex and concave portions formed on a surface thereof was arranged instead of the UV shielding plate between the UV source and the photo-curable resin composition to expose a peripheral part of a protective film to an incident UV ray and to limit incidence of the UV ray at a main surface part of the panel with the attenuation plate. Further, a liquid crystal display device and a bonded glass structure for adhesive strength measurement were formed in the same manner as in Example 6, except that a UV ray was applied to make the cure rate of the pre-cured resin layer on the light-shielding layer about 70% and that of the pre-cured resin layer on the surface of the light-transmitting cover member about 20%.
<Evaluations>

The presence or absence of elimination of the photo-curable resin composition from between the light-shielding layer and the image display member, and the adhesive state of the liquid crystal display device in each step of Example 10 were evaluated in the same manner as in Example 6. As a result, the cure rate of the light-transmitting cured resin layer on the light-shielding layer was about 95%, and elimination of the photo-curable resin composition was not observed in resultants in all the steps and the finished liquid crystal display device. Further, the adhesive state was evaluated as "A." Results of Examples 10 to 13 and Comparative Example 8 are summarized in Table 3.

Example 11

A liquid crystal display device and a bonded glass structure for adhesive strength measurement were formed in the same manner as in Example 6, except that a UV ray was applied to make the cure rate of the pre-cured resin layer on the light-shielding layer about 70% and that of the pre-cured resin layer on the surface of the light-transmitting cover member about 40% in the step (b) of Example 10. As a result, the cure rate of the light-transmitting cured resin layer on the light-shielding layer was about 95%, and elimination of the photo-curable resin composition was not observed in resultants in all the steps and the finished liquid crystal display device. Further, the adhesive state was evaluated as "A."

Example 12

A liquid crystal display device and a bonded glass structure for adhesive strength measurement were formed in the same manner as in Example 6, except that a UV ray was applied to make the cure rate of the pre-cured resin layer on the light-shielding layer about 70% and that of the pre-cured resin layer on the surface of the light-transmitting cover member about 60% in the step (b) of Example 10. As a result, the cure rate of the light-transmitting cured resin layer on the light-shielding layer was about 95%, and elimination of the photo-curable resin composition was not observed in resultants in all the steps and the finished liquid crystal display device. Further, the adhesive state was evaluated as "B."

Example 13

A liquid crystal display device and a bonded glass structure for adhesive strength measurement were formed in the same manner as in Example 6, except that a UV ray was applied to make the cure rate of the pre-cured resin layer on the light-shielding layer about 70% and that of the pre-cured resin layer on the surface of the light-transmitting cover member about 80% in the step (b) of Example 10. As a result, the cure rate of the light-transmitting cured resin layer on the light-shielding layer was about 95%, and elimination of the photo-curable resin composition was not observed in resultants in all the steps and the finished liquid crystal display device. Further, the adhesive state was evaluated as "B."

Comparative Example 8

A liquid crystal display device and a bonded glass structure for adhesive strength measurement were formed in the same manner as in Example 6, except that a UV ray was applied to make the cure rate of the pre-cured resin layer on the light-shielding layer about 70% and that of the pre-cured resin layer on the surface of the light-transmitting cover member about 90% in the step (b) of Example 10. As a result, the cure rate of the light-transmitting cured resin layer on the light-shielding layer was about 95%, and elimination of the photo-curable resin composition was not observed in resultants in all the steps and the finished liquid crystal display device. Meanwhile, the adhesive state was evaluated as "C."

TABLE 3

|  |  | Example | | | | Comparative Example |
|---|---|---|---|---|---|---|
|  |  | 10 | 11 | 12 | 13 | 8 |
| Cure Rate of Pre-cured Resin Layer (%) | Position on Light-shielding Layer | 70 | 70 | 70 | 70 | 70 |
|  | Position on Cover Member | 20 | 40 | 60 | 80 | 90 |
| Cure Rate of Cured Resin Layer (%) | Position on Light-shielding Layer | 90 | 95 | 95 | 95 | 95 |
|  | Position on Cover Member | 95≤ | 95≤ | 95≤ | 95≤ | 95≤ |
| Presence or Absence of Elimination of Photo-curable Resin Composition |  | Absent | Absent | Absent | Absent | Absent |
| Evaluation of Adhesive State |  | A | A | A | B | C |

In the case of Comparative Example 8 shown in Table 3, interfacial delamination was generated in the cured resin layer on the light-transmitting cover member when the cure rate of the pre-cured resin layer on the light-transmitting cover member was about 90% in the step (b) (pre-curing step). Thus, the adhesive state was evaluated as "C."

In contrast, in the cases of Examples 10 to 13, the cure rate of the pre-cured resin layer on the light-shielding layer was higher than that of the pre-cured resin layer on the light-transmitting cover member in the step (b) (pre-curing step), so that complete curing of a cure rate of 90% or more could be achieved on the entire light-shielding layer and the entire light-transmitting cover member in the step (d) (complete curing step). As a result, elimination of the photo-curable resin composition from between the light-shielding layer and the image display member was not observed and the adhesive state was evaluated as A or B.

INDUSTRIAL APPLICABILITY

According to the method of manufacturing an image display device of the present invention, a light-transmitting cured resin layer between a light-shielding layer and an image display member can be photo-cured sufficiently without being eliminated from therebetween, and a step formed between the light-shielding layer and a light-shielding layer forming surface of the light-transmitting cover member can be canceled. Thus, the manufacturing method of the present invention has usefulness in industrial manufacture of information terminals such as smartphones with touch panels and touch pads.

REFERENCE SIGNS LIST 1 light-shielding layer
2 light-transmitting cover member
2a light-shielding layer forming surface of light-transmitting cover member
3, 3a, 3b photo-curable resin composition
4 step
5, 5a, 5b pre-cured resin layer
6 image display member
7 light-transmitting cured resin layer
10 image display device
20 attenuate plate
30 glass base
31 glass plate

The invention claimed is:

1. A method of manufacturing an image display device in which an image display member and a light-transmitting cover member with a light-shielding layer formed on a peripheral part of a surface thereof are stacked via a light-transmitting cured resin layer formed of a liquid photo-curable resin composition, the method comprising:
applying the liquid photo-curable resin composition to the surface of the light-transmitting cover member on which the light-shielding layer is formed, a thickness of the applied liquid photo-curable resin composition being greater than a thickness of the light-shielding layer such that the liquid photo-curable resin composition is also formed on a surface of the light-shielding layer, wherein the photo-curable resin composition consists essentially of: (i) a single photo-curable polymer component consisting of photoradical polymerizable components including a photoradical polymerizable poly(meth)acrylate, (ii) optionally a plasticizer, and (iii) optionally a photopolymerization initiator;
irradiating the applied photo-curable resin composition with a UV ray to pre-cure the photo-curable resin composition, thereby forming a pre-cured resin layer having a surface that is perpendicular to a stacking direction of the image display device but is not contiguous with the surface of the light-transmitting cover member or the surface of the light-shielding member, a distance from the surface of the light-transmitting cover member to the surface of the pre-cured resin layer along the stacking direction of the image display device being constant regardless of the presence of the light-shielding layer, wherein the pre-curing rate is 10% to 80% and the pre-curing rate is kept constant during the irradiation of the photo-curable resin composition;
bonding the light-transmitting cover member to the image display member such that the light-shielding layer and the pre-cured resin layer are in between the light-transmitting cover member and the image display member, wherein the bonding is performed by applying pressure at from 10° C. to 80° C. using a pressure bonding device; and irradiating the pre-cured resin layer between the image display member and the light-transmitting cover member with a UV ray to completely cure the pre-cured resin layer to form the light-transmitting cured resin layer such that the image display member and the light-transmitting cover member are stacked via the light-transmitting cured resin layer, thereby obtaining the image display device, wherein the curing rate is 90% or more, and the curing rate is kept constant during the irradiation of the pre-cured resin layer.

2. The manufacturing method according to claim 1, wherein the image display member is a liquid crystal display panel, an organic EL display panel, a plasma display panel, or a touch panel.

3. The manufacturing method according to claim 1, wherein the thickness of the applied photo-curable resin composition is in a range of from 1.2 to 50 times that of the light-shielding layer.

4. The manufacturing method according to claim 1, wherein the photoradical polymerizable components include a polyurethane-based (meth)acrylate or a polyisoprene-based (meth)acrylate, and the plasticizer includes a tackifier.

5. The manufacturing method according to claim 1, wherein at least part of the photo-curable resin composition that is present on the light-shielding layer is irradiated with a UV ray to be pre-cured such that a cure rate of the pre-cured resin layer on the light-shielding layer is in a range of from 30 to 80%.

6. The manufacturing method according to claim 5, wherein a shielding plate to shield a UV ray or an attenuation plate to attenuate a UV ray is disposed between a UV source and the applied photo-curable resin composition during the UV irradiation.

7. The manufacturing method according to claim 1, wherein the photoradical polymerizable components include an acrylate-based oligomer component and an acrylic monomer component, and the plasticizer component includes a solid tackifier and a liquid oil component.

8. A method of manufacturing an image display device in which an image display member and a light-transmitting cover member with a light-shielding layer formed on a peripheral part of a surface thereof are stacked via a light-transmitting cured resin layer formed of a liquid photo-curable resin composition, the method comprising:

applying the liquid photo-curable resin composition to the surface of the light-transmitting cover member on which the light-shielding layer is formed, a thickness of the applied liquid photo-curable resin composition being greater than a thickness of the light-shielding layer such that the liquid photo-curable resin composition is also formed on a surface of the light-shielding layer, wherein the photo-curable resin composition consists of photoradical polymerizable components, a plasticizer component, a photopolymerization initiator component, and a tackifier, and the photo-curable resin composition contains a photoradical polymerizable poly(meth)acrylate as a main component;

irradiating the applied photo-curable resin composition with a UV ray to pre-cure the photo-curable resin composition, thereby forming a pre-cured resin layer having a surface that is perpendicular to a stacking direction of the image display device but is not contiguous with the surface of the light-transmitting cover member or the surface of the light-shielding member, a distance from the surface of the light-transmitting cover member to the surface of the pre-cured resin layer along the stacking direction of the image display device being constant regardless of the presence of the light-shielding layer, wherein the pre-curing rate is 10% to 80% and the pre-curing rate is kept constant during the irradiation of the photo-curable resin composition;

bonding the light-transmitting cover member to the image display member such that the light-shielding layer and the pre-cured resin layer are in between the light-transmitting cover member and the image display member, wherein the bonding is performed by applying pressure at from 10° C. to 80° C. using a pressure bonding device; and irradiating the pre-cured resin layer between the image display member and the light-transmitting cover member with a UV ray to completely cure the pre-cured resin layer to form the light-transmitting cured resin layer such that the image display member and the light-transmitting cover member are stacked via the light-transmitting cured resin layer, thereby obtaining the image display device, wherein the curing rate is 90% or more, and the curing rate is kept constant during the irradiation of the pre-cured resin layer.

9. The manufacturing method according to claim 8, wherein the image display member is a liquid crystal display panel, an organic EL display panel, a plasma display panel, or a touch panel.

10. The manufacturing method according to claim 8, wherein the thickness of the applied photo-curable resin composition is in a range of from 1.2 to 50 times that of the light-shielding layer.

11. The manufacturing method according to claim 8, wherein the photoradical polymerizable components include a polyurethane-based (meth)acrylate or a polyisoprene-based (meth)acrylate.

12. The manufacturing method according to claim 8, wherein at least part of the photo-curable resin composition that is present on the light-shielding layer is irradiated with a UV ray to be pre-cured such that a cure rate of the pre-cured resin layer on the light-shielding layer is in a range of from 30 to 80%.

13. The manufacturing method according to claim 12, wherein a shielding plate to shield a UV ray or an attenuation plate to attenuate a UV ray is disposed between a UV source and the applied photo-curable resin composition during the UV irradiation.

14. The manufacturing method according to claim 8, wherein the photoradical polymerizable components include an acrylate-based oligomer component and an acrylic monomer component, and the plasticizer component includes a solid tackifier and a liquid oil component.

* * * * *